(12) United States Patent
Ju

(10) Patent No.: US 12,063,835 B2
(45) Date of Patent: Aug. 13, 2024

(54) ORGANIC LIGHT EMITTING DISPLAY DEVICE AND METHOD OF MANUFACTURING ORGANIC LIGHT EMITTING DISPLAY DEVICE

(71) Applicant: SAMSUNG DISPLAY CO., LTD., Yongin-si (KR)

(72) Inventor: Sungbae Ju, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/458,011

(22) Filed: Aug. 29, 2023

(65) Prior Publication Data

US 2023/0413635 A1 Dec. 21, 2023

Related U.S. Application Data

(62) Division of application No. 17/195,901, filed on Mar. 9, 2021, now Pat. No. 11,751,457.

(30) Foreign Application Priority Data

Jul. 31, 2020 (KR) ........................ 10-2020-0096278

(51) Int. Cl.
*H10K 59/35* (2023.01)
*H10K 50/844* (2023.01)
*H10K 71/00* (2023.01)

(52) U.S. Cl.
CPC ......... *H10K 59/352* (2023.02); *H10K 50/844* (2023.02); *H10K 71/00* (2023.02)

(58) Field of Classification Search
CPC .... H10K 59/352; H10K 50/844; H10K 71/00; H10K 59/1201; H10K 71/80; H10K 77/111; H10K 59/38; H10K 2102/311; H10K 59/88; H10K 59/124; H10K 59/12; H10K 50/8426; H10K 59/65; Y02E 10/549
See application file for complete search history.

(56) References Cited

U.S. PATENT DOCUMENTS

| 8,530,910 | B2 * | 9/2013 | Song | H10K 59/131 |
| | | | | 313/500 |
| 9,997,738 | B2 * | 6/2018 | Choi | H10K 50/80 |
| 10,283,581 | B2 * | 5/2019 | Kim | H10K 50/824 |
| 10,690,973 | B2 * | 6/2020 | Yueh | H10K 50/80 |

(Continued)

FOREIGN PATENT DOCUMENTS

| CN | 109801945 A | 5/2019 |
| CN | 110603644 A | 12/2019 |

(Continued)

*Primary Examiner* — Caleb E Henry
(74) *Attorney, Agent, or Firm* — Lewis Roca Rothgerber Christie LLP

(57) ABSTRACT

An organic light emitting display device includes: a substrate including: pixel regions; connection regions between adjacent pixel regions from among the pixel regions, respectively; and a region having a through-opening, the region being defined by the adjacent pixel regions, and the connection regions respectively between the adjacent pixel regions; a sub-pixel structure on the substrate at each of the pixel regions; and an organic pattern on a side wall of the substrate, the side wall being adjacent to the through-opening.

6 Claims, 22 Drawing Sheets

(56) References Cited

U.S. PATENT DOCUMENTS

| | | | |
|---|---|---|---|
| 2013/0203197 A1* | 8/2013 | Tsai | H10K 50/824 |
| | | | 438/34 |
| 2016/0190389 A1* | 6/2016 | Lee | A61B 5/0075 |
| | | | 438/28 |
| 2017/0148856 A1* | 5/2017 | Choi | H10K 59/124 |
| 2017/0162637 A1* | 6/2017 | Choi | G09G 3/3225 |
| 2017/0221982 A1* | 8/2017 | Park | H10K 50/856 |
| 2020/0013834 A1* | 1/2020 | Park | H10K 59/8731 |
| 2020/0144535 A1* | 5/2020 | Kim | H10K 59/65 |
| 2020/0212140 A1* | 7/2020 | Huh | H01L 25/0753 |

FOREIGN PATENT DOCUMENTS

| | | |
|---|---|---|
| KR | 10-1810050 B1 | 12/2017 |
| KR | 10-1984734 B1 | 6/2019 |

* cited by examiner

FIG. 6
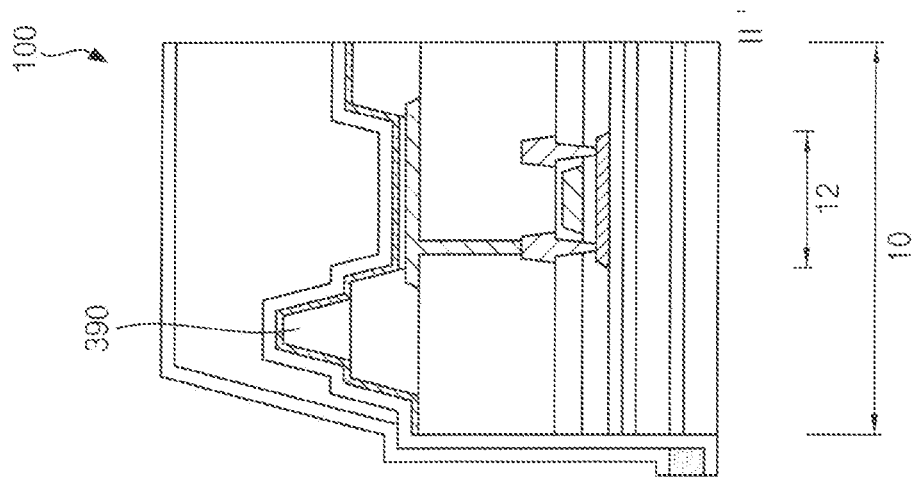
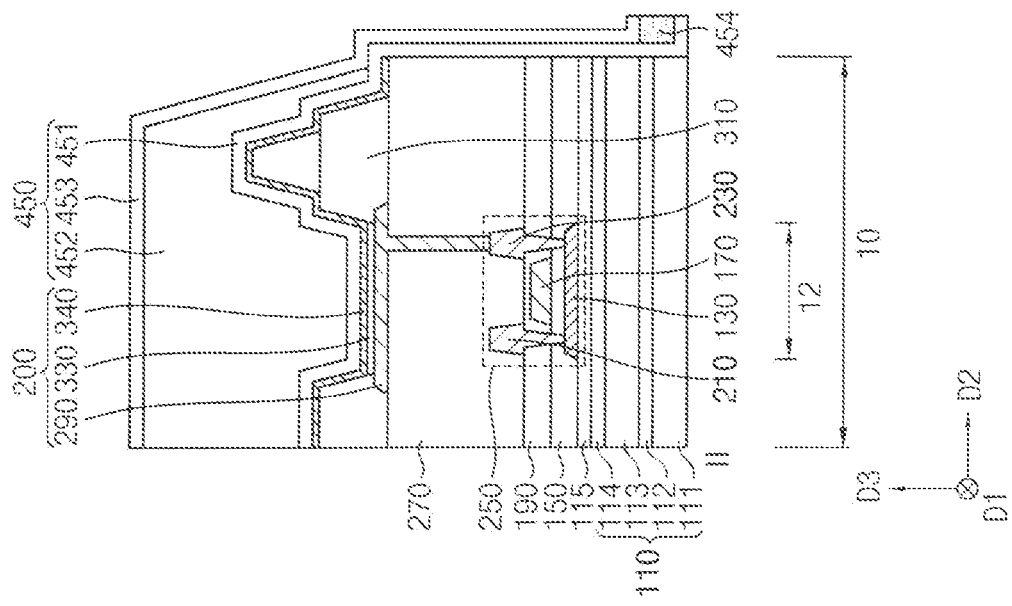

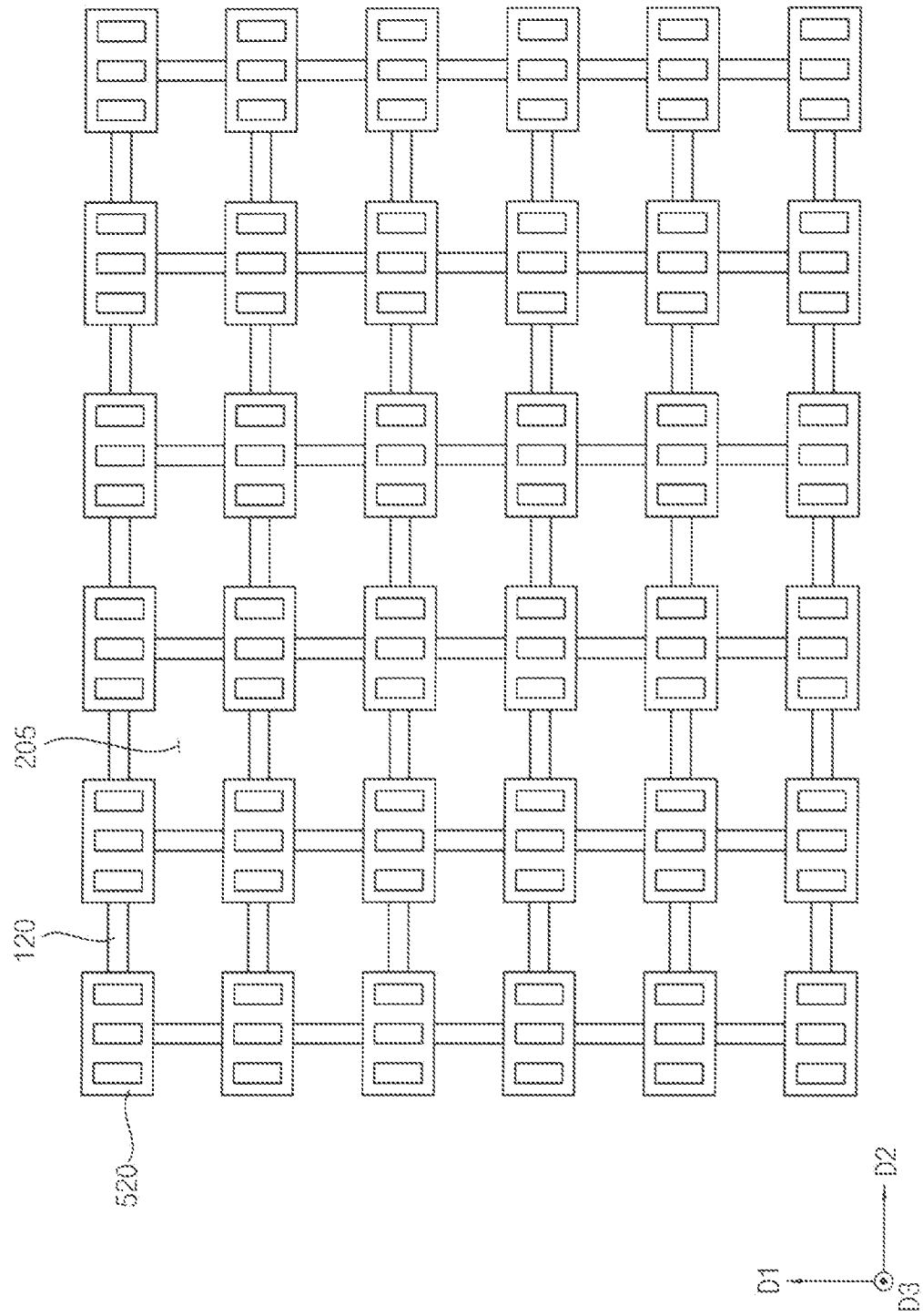

ORGANIC LIGHT EMITTING DISPLAY DEVICE AND METHOD OF MANUFACTURING ORGANIC LIGHT EMITTING DISPLAY DEVICE

CROSS-REFERENCE TO RELATED APPLICATIONS

This application is a divisional of U.S. patent application Ser. No. 17/195,901, filed Mar. 9, 2021, which claims priority to and the benefit of Korean Patent Application No. 10-2020-0096278, filed Jul. 31, 2020, the entire content of both of which is incorporated herein by reference.

BACKGROUND

1. Field

Aspects of embodiments of the present disclosure relate generally to an organic light emitting display device, and a method of manufacturing an organic light emitting display device. More particularly, aspects of embodiments of the present disclosure relate to an organic light emitting display device including an organic pattern, and a method of manufacturing the organic light emitting display device including the organic pattern.

2. Description of the Related Art

Flat panel display devices are used as display devices for replacing a cathode ray tube display device due to having lightweight and thin characteristics. Some representative examples of such flat panel display devices include a liquid crystal display device and an organic light emitting display device.

In the organic light emitting display device, after a substrate is formed of a flexible material, a plurality of through-openings may be formed in the substrate to manufacture a stretchable substrate. A stretchable organic light emitting display device that may be disposed on a curved surface or an uneven surface by using the stretchable substrate without causing a lifting phenomenon is being developed.

The above information disclosed in this Background section is for enhancement of understanding of the background of the present disclosure, and therefore, it may contain information that does not constitute prior art.

SUMMARY

During a process of peeling a substrate from a glass substrate in a method of manufacturing a stretchable organic light emitting display device, a thin film encapsulation layer included in the stretchable organic light emitting display device may be excessively torn off on a side wall of the substrate. In this case, a path for blocking permeation of water and/or moisture that may infiltrate from the outside may be relatively shortened at the side wall of the substrate, which may cause the infiltration of water and/or moisture into the substrate. When water and/or moisture infiltrate into the substrate from the outside, a defect of the stretchable organic light emitting display device may be caused.

Some embodiments of the present disclosure are directed to an organic light emitting display device including an organic pattern.

Some embodiments of the present disclosure are directed to a method of manufacturing an organic light emitting display device including an organic pattern.

According to some embodiments of the present disclosure, an organic light emitting display device includes: a substrate including: pixel regions; connection regions between adjacent pixel regions from among the pixel regions, respectively; and a region having a through-opening, the region being defined by the adjacent pixel regions, and the connection regions respectively between the adjacent pixel regions; a sub-pixel structure on the substrate at each of the pixel regions; and an organic pattern on a side wall of the substrate, the side wall being adjacent to the through-opening.

In some embodiments, in a plan view of the organic light emitting display device, the organic pattern may extend along an outermost periphery of the region defined by the adjacent pixel regions and the connection regions respectively between the adjacent pixel regions.

In some embodiments, the organic light emitting display device may further include a thin film encapsulation structure on the sub-pixel structure, the thin film encapsulation structure including: a first inorganic thin film encapsulation layer on the sub-pixel structure; an organic thin film encapsulation layer on the first inorganic thin film encapsulation layer; and a second inorganic thin film encapsulation layer on the organic thin film encapsulation layer.

In some embodiments, the organic pattern and the organic thin film encapsulation layer may include a same material as each other.

In some embodiments, the organic pattern may contact the first inorganic thin film encapsulation layer and the second inorganic thin film encapsulation layer.

In some embodiments, the first inorganic thin film encapsulation layer may extend in a direction from the sub-pixel structure to the through-opening, and between the side wall of the substrate that is adjacent to the through-opening and the organic pattern, and the second inorganic thin film encapsulation layer may extend in the direction, and may be on the first inorganic thin film encapsulation layer that is on the side wall of the substrate.

In some embodiments, the second inorganic thin film encapsulation layer may contact the organic pattern on the side wall of the substrate.

In some embodiments, the first inorganic thin film encapsulation layer may include a protrusion that protrudes in a direction from the side wall to the through-opening of the substrate from a portion of the first inorganic thin film encapsulation layer that is adjacent to a bottom surface of the substrate.

In some embodiments, the organic light emitting display device may further include: a gate insulating layer on the substrate; an interlayer insulating layer on the gate insulating layer; and a planarization layer on the interlayer insulating layer. A side wall of each of the gate insulating layer, the interlayer insulating layer, and the planarization layer that is adjacent to the through-opening may contact the first inorganic thin film encapsulation layer.

In some embodiments, the substrate may have an island shape at each of the pixel regions, and the substrate may have a bar shape at each of the connection regions.

In some embodiments, the connection regions may include: a first connection region extending in a first direction; and a second connection region extending in a second direction orthogonal to the first direction. One side of one pixel region from among the pixel regions may contact the first connection region, and an adjacent side of the one pixel region may contact the second connection region.

In some embodiments, the substrate may have an island shape at each of the pixel regions, and the substrate may have a U-shape, an S-shape, or a W-shape at each of the connection regions.

In some embodiments, the substrate at each of the connection regions may be stretchable.

In some embodiments, the substrate may include a mesh structure having a plurality of through-openings, and one of the through-openings may be defined by the substrate at each of at least three adjacent pixel regions from among the pixel regions, and at least three connection regions configured to connect the at least three adjacent pixel regions to one another other from among the connection regions.

According to some embodiments of the present disclosure, a method of manufacturing an organic light emitting display device, includes: providing a glass substrate including: pixel regions; connection regions between adjacent pixel regions from among the pixel regions, respectively; and a contact region surrounded by the adjacent pixel regions and the connection regions respectively between the adjacent pixel regions; forming a contact pattern on the glass substrate at the contact region; forming a preliminary substrate on the glass substrate and the contact pattern; forming a sub-pixel structure on the preliminary substrate at each of the pixel regions; forming an opening that exposes a part of the contact pattern and a part of the glass substrate by removing a portion of the preliminary substrate that overlaps with an outermost periphery portion of the contact region; and forming a substrate at the pixel regions and the connection regions, and a dummy pattern on the contact pattern, after forming the opening.

In some embodiments, the method may further include: forming a first inorganic thin film encapsulation layer over an entire area of the glass substrate; forming a part of an organic thin film encapsulation layer in the opening while forming the organic thin film encapsulation layer on the first inorganic thin film encapsulation layer; and forming a second inorganic thin film encapsulation layer on the first inorganic thin film encapsulation layer and the organic thin film encapsulation layer.

In some embodiments, the part of the organic thin film encapsulation layer in the opening may be defined as an organic pattern, and the organic pattern may be surrounded by the first and second inorganic thin film encapsulation layers.

In some embodiments, the method may further include peeling the substrate from the glass substrate while the dummy pattern formed on the contact pattern is fixed onto the glass substrate.

In some embodiments, a through-opening surrounded by the substrate at the adjacent pixel regions and the connection regions respectively between the adjacent pixel regions may be defined after the substrate is peeled from the glass substrate.

In some embodiments, the contact pattern may include a protrusion that protrudes in a direction from the glass substrate to the sub-pixel structure from a top surface of the contact pattern at an outermost peripheral portion of the contact pattern, and the protrusion may be exposed by the opening.

According to one or more embodiments of the present disclosure, the organic light emitting display device may include the first inorganic thin film encapsulation layer and the second inorganic thin film encapsulation layer. The first and second inorganic thin film encapsulation layers may cover (e.g., may completely cover) the side wall of each of the substrate, the buffer layer, the gate insulating layer, the interlayer insulating layer, and the planarization layer, so that water and/or moisture that may infiltrate into the side walls from the outside through the through-opening may be blocked or substantially blocked (e.g., may be completely blocked).

According to one or more embodiments of the present disclosure, because the organic pattern may be disposed on the side wall of the substrate adjacent to the through-opening, a path for blocking permeation of water and/or moisture may be relatively increased at the side wall of the substrate.

According to one or more embodiments of the present disclosure, in the method of manufacturing the organic light emitting display device, because the organic pattern and the protrusion of the contact pattern may be formed at a portion of the glass substrate where the opening is located, the thickness of the second inorganic thin film encapsulation layer may not be reduced (e.g., may not become thinner) inside the opening, and the second inorganic thin film encapsulation layer may not be excessively torn off in a process of peeling the substrate from the glass substrate. Accordingly, a defect of the organic light emitting display device may be reduced.

According to one or more embodiments of the present disclosure, because the protrusion of the contact pattern may be formed in the opening, the area in which the first inorganic thin film encapsulation layer makes contact with the glass substrate may be relatively reduced, and the first inorganic thin film encapsulation layer may be easily peeled from the glass substrate in the peeling process.

BRIEF DESCRIPTION OF THE DRAWINGS

The above and other aspects and features of the present disclosure will be more clearly understood from the following detailed description of the illustrative, non-limiting embodiments with reference to the accompanying drawings, in which:

FIG. 6 is a cross-sectional view taken along the line II-II' of the organic light emitting display device of FIG. 1; and FIGS. 7-22 are views showing a method of manufacturing an organic light emitting display device according to one or more embodiments of the present disclosure.

DETAILED DESCRIPTION

Figure 1:
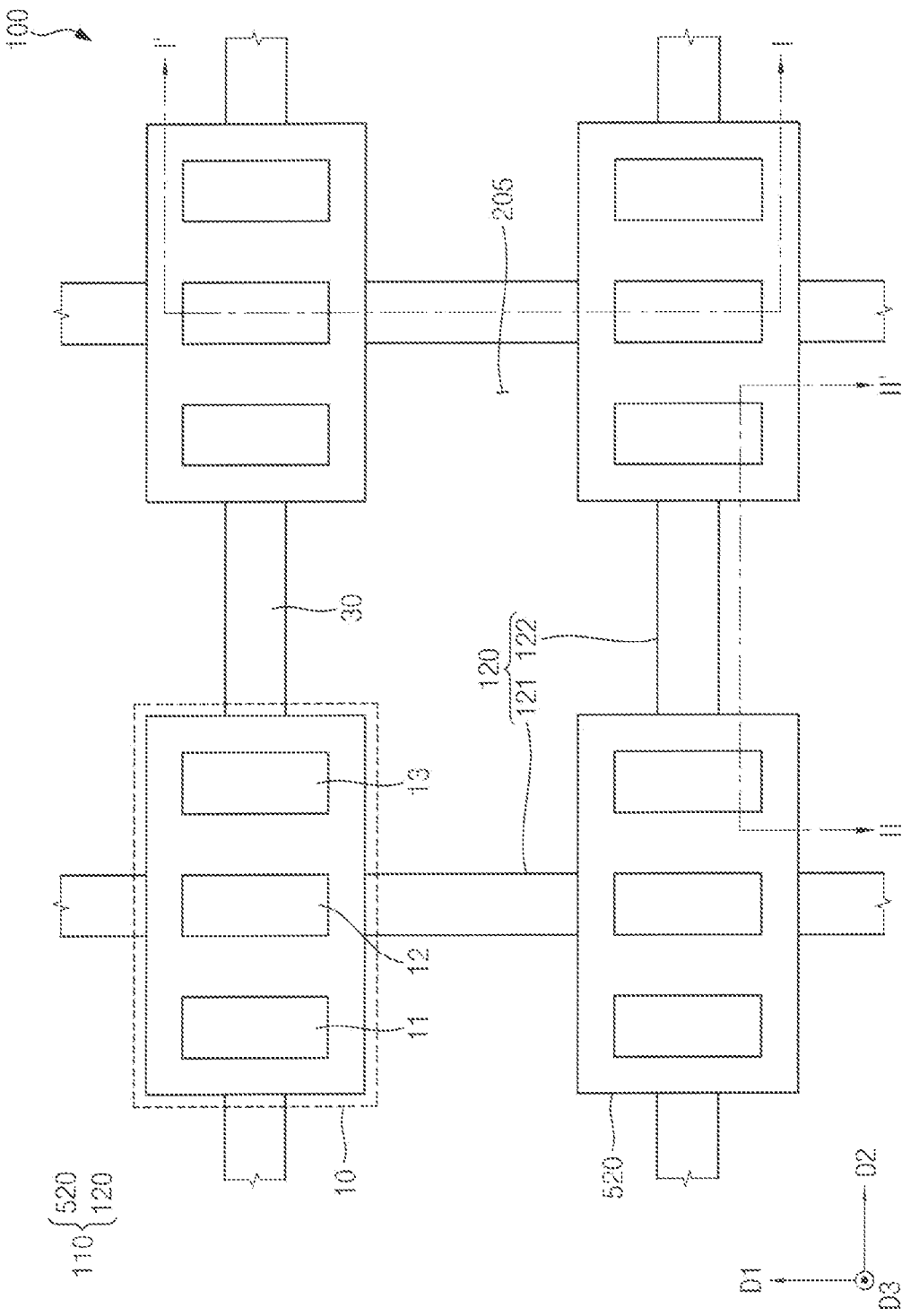
FIG. 1 is a plan view showing an organic light emitting display device according to one or more embodiments of the present disclosure.

Hereinafter, embodiments of the present disclosure will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
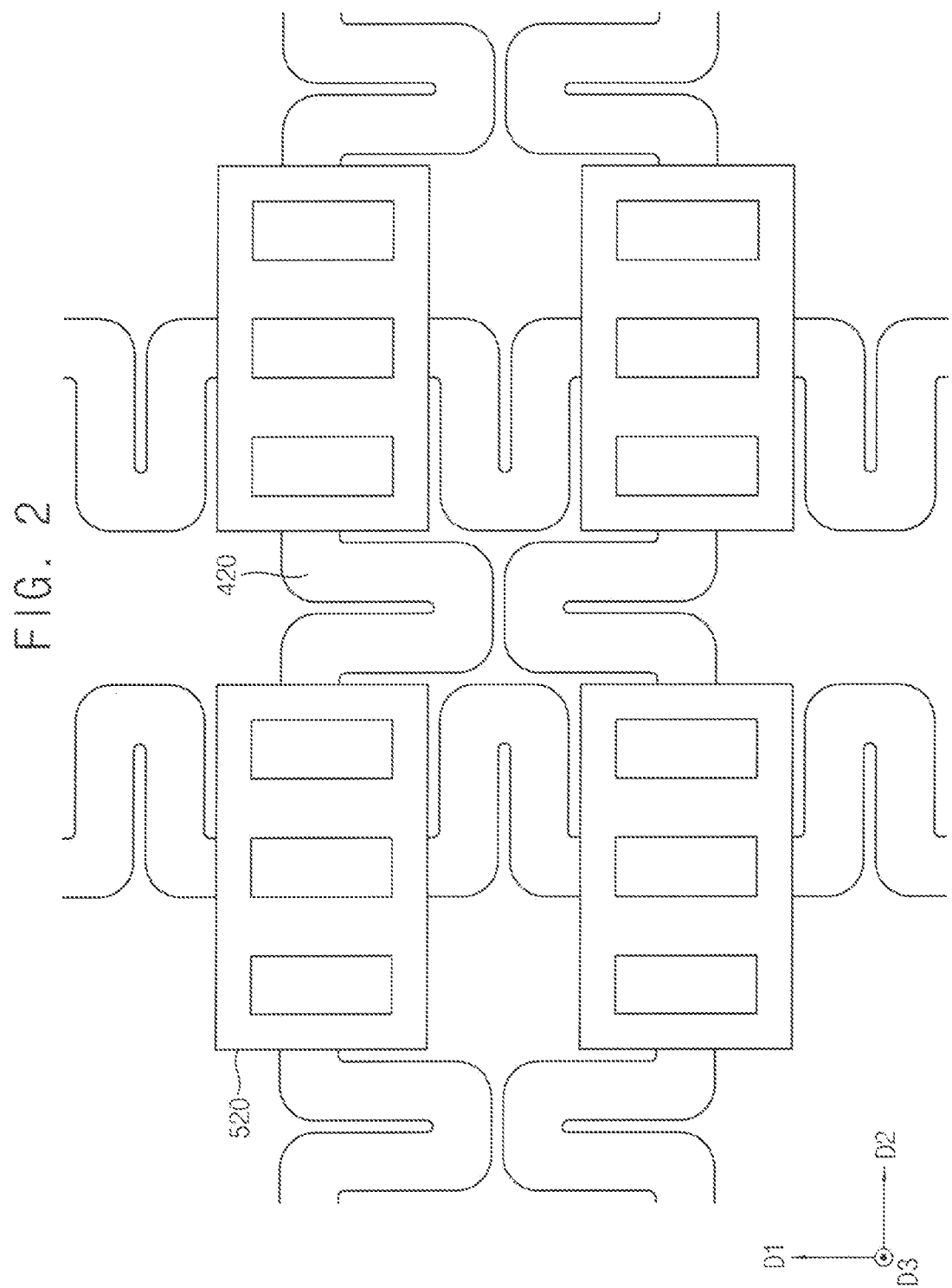
FIGS. 2-4 are plan views showing an example of a substrate included in the organic light emitting display device of FIG. 1.
Figure 3:
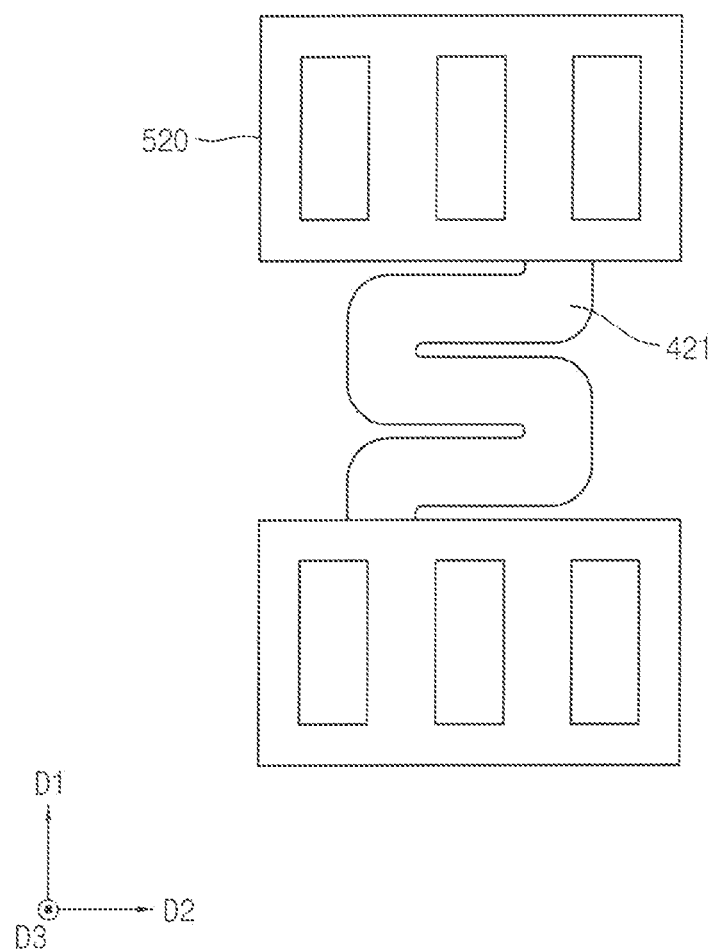
Figure 4:
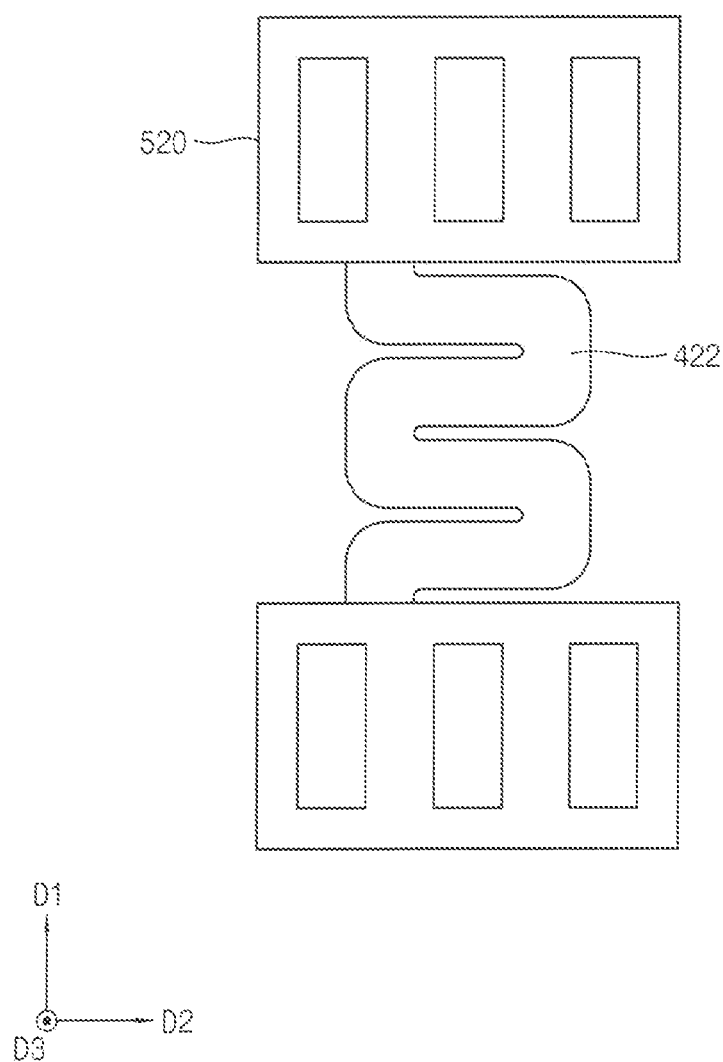

FIG. 1 is a plan view showing an organic light emitting display device according to one or more embodiments of the present disclosure, and FIGS. 2 to 4 are plan views showing an example of a substrate included in the organic light emitting display device of FIG. 1.

Referring to FIGS. 1 and 2, an organic light emitting display device 100 may include a substrate 110.

The substrate 110 may include pixel regions 10, and connection regions 30. In this case, one pixel region 10 from among the pixel regions 10 may include a first sub-pixel region 11, a second sub-pixel region 12, and a third sub-pixel region 13. In other words, each of the pixel regions 10 may include first to third sub-pixel regions 11, 12, and 13.

As shown in FIG. 22, the pixel regions 10 may be arranged in a first direction D1 that is parallel to or substantially parallel to a top surface of the organic light emitting display device 100, and in a second direction D2 that crosses (e.g., that is orthogonal to or substantially orthogonal to) the first direction D1. The pixel regions 10 may be spaced apart from each other, and the connection regions 30 may be located between adjacent pixel regions 10 from among the pixel regions 10, respectively. In other words, one connection region 30 may be located between two adjacent pixel regions 10 from among the pixel regions 10.

In one or more embodiments, through-openings 205 may be formed in the substrate 110. For example, one through-opening 205 from among the through-openings 205 may be formed in a region defined by the adjacent pixel regions 10 from among the pixel regions 10, and the connection regions 30 located between the adjacent pixel regions 10, respectively. In other words, one through-opening 205 from among the through-openings 205 may be surrounded (e.g., around a periphery thereof) by at least three adjacent pixel regions 10 from among the pixel regions 10, and at least three connection regions 30 configured to connect the at least three adjacent pixel regions 10 to one another.

Referring back to FIG. 1, for convenience of description, the substrate 110 located at (e.g., in or on) each of the pixel regions 10 is defined as a display part 520, and the substrate 110 located at (e.g., in or on) each of the connection regions 30 is defined as a connection part 120. In other words, the substrate 110 may include the display part 520 and the connection part 120.

In a plan view (e.g., a view from a direction that is perpendicular to or substantially perpendicular to a top surface of the relevant element or layer) of the organic light emitting display device 100, each of the display parts 520 may have an island shape, and each of the connection parts 120 may have a bar shape. In addition, the substrate 110 including the display parts 520 and the connection parts 120 may have a mesh structure defined by the through-openings

205. For example, the through-opening 205 may be defined by four adjacent display parts 520 from among the display parts 520, and four adjacent connection parts 120 from among the connection parts 120.

First to third sub-pixels (e.g., see sub-pixel structures 200 of FIGS. 5 and 6) may be disposed at (e.g., in or on) the first to third sub-pixel regions 11, 12, and 13, respectively, at (e.g., in or on) the display part 520. For example, the first sub-pixel may emit red light, the second sub-pixel may emit green light, and the third sub-pixel may emit blue light. The organic light emitting display device 100 may display an image through the first to third sub-pixels in a third direction (e.g., a thickness direction) D3 that is perpendicular to or substantially perpendicular to the first and second directions D1 and D2.

Although the one pixel region 10 has been described as including three sub-pixel regions 11, 12, and 13, the configuration of the one pixel region 10 according to one or more embodiments of the present disclosure is not limited thereto. For example, the one pixel region 10 may include at least one sub-pixel region. In other words, according to various embodiments, the one pixel region 10 may include one or more sub-pixel regions, and thus, the present disclosure is not limited to the three sub-pixel regions 11, 12, and 13 shown in FIG. 1.

Wires (e.g., a gate signal wire, a data signal wire, a power supply voltage wire, and/or the like) may be disposed at (e.g., in or on) the connection part 120. An image signal and a power supply voltage may be provided to the first to third sub-pixels through the wires.

Although the display part 520 is shown in FIG. 1 as having a rectangular shape in a plan view, the configuration of the display part 520 according to one or more embodiments of the present disclosure is not limited thereto. For example, each of the display part 520 and the connection part 120 may have a triangular shape, a rhombic shape, a polygonal shape, a circular shape, a track shape, or an elliptical shape in a plan view.

In one or more embodiments, when the display part 520 has a rectangular shape in a plan view, each of the connection parts 120 may include a first connection part 121 (e.g., a first connection region) extending in the first direction D1, and a second connection part 122 (e.g., a second connection region) extending in the second direction D2. The first connection parts 121 may be arranged in the first direction D1 (e.g., a column direction), and the second connection parts 122 may be arranged in the second direction D2 (e.g., a row direction). For example, one side of the display part 520 (e.g., side surfaces of the display part 520 that are parallel to or substantially parallel to the second direction D2) may contact (e.g., may make contact with) the first connection part 121, and an adjacent side of the display part 520 (e.g., side surfaces of the display part 520 that are parallel to or substantially parallel to the first direction D1) may contact (e.g., may make contact with) the second connection part 122.

The connection part 120 may be stretchable. For example, when the display parts 520 are irregularly arranged, the shapes of the connection parts 120 may be changed so that the irregular arrangement of the display parts 520 may be maintained or substantially maintained. For example, the connection part 120 may be stretched, contracted, bent, and/or folded. In this case, the shape of the through-opening 205 may also be changed.

Referring to FIGS. 2 to 4, the connection part 120 may have various different suitable shapes. For example, as shown in FIG. 2, a connection part 420 may have a U-shape or substantially a U-shape. In addition, as shown in FIG. 3, a connection part 421 may have an S-shape or substantially an S-shape. Further, as shown in FIG. 4, a connection part 422 may have a W-shape or substantially a W-shape. In this case, the stretchability of the connection parts 420, 421, and 422 may be increased. For example, each of the connection parts 420, 421, and 422 may have a spring shape so as to be stretched relatively more than the connection part 120 having the bar shape, and the connection parts 420, 421, and 422 may be stretched, contracted, bent, and/or folded relatively easily.

Although the connection parts 420, 421, and 422 have been described as having a U-shape, an S-shape, and a W-shape, respectively, the configuration of the connection parts 420, 421, and 422 according to one or more embodiments of the present disclosure is not limited thereto. For example, the connection parts 420, 421, and 422 may have various suitable shapes.

Referring back to FIG. 1, the display parts 520 and the connection parts 120 may be integrally formed. For example, after a preliminary substrate (e.g., a preliminary substrate 510 of FIG. 12) is provided, the substrate 110 that is divided into the display parts 520 and the connection parts 120 may be provided by forming the through-openings 205 in the preliminary substrate. In other words, the display parts 520 and the connection parts 120 may be concurrently formed by using the same or substantially the same material.

The organic light emitting display device 100 may include the substrate 110 having the through-openings 205, so as to be easily disposed on a curved surface or an uneven surface without a lifting phenomenon. Accordingly, the organic light emitting display device 100 may also function as a stretchable organic light emitting display device having a curved shape.

Figure 5:
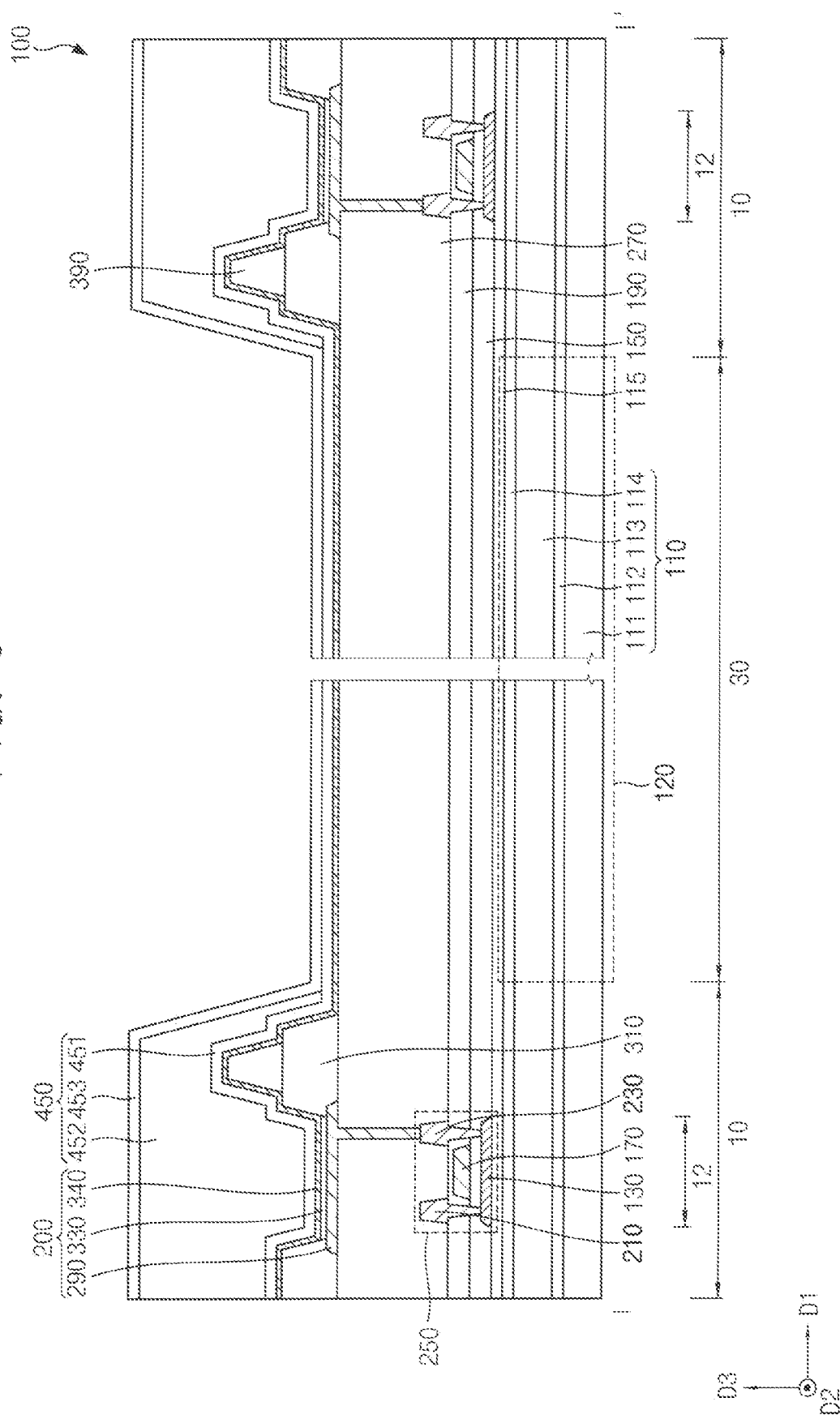
FIG. 5 is a cross-sectional view taken along the line I-I' of the organic light emitting display device of FIG. 1.

FIG. 5 is a sectional view taken along the line I-I' of the organic light emitting display device of FIG. 1, and FIG. 6 is a sectional view taken along the line II-II' of the organic light emitting display device of FIG. 1.

Referring to FIGS. 5 and 6, the organic light emitting display device 100 may include the substrate 110, a buffer layer 115, a semiconductor element 250, a gate insulating layer 150, an interlayer insulating layer 190, a planarization layer 270, a sub-pixel structure 200, a pixel defining layer 310, a spacer 390, a thin film encapsulation structure 450, an organic pattern 454, and the like. In this case, the substrate 110 may include a first organic film layer 111, a first barrier layer 112, a second organic film layer 113, and a second barrier layer 114. The semiconductor element 250 may include an active layer 130, a gate electrode 170, a source electrode 210, and a drain electrode 230. The sub-pixel structure 200 may include a lower electrode 290, a light emitting layer 330, and an upper electrode 340. The thin film encapsulation structure 450 may include a first inorganic thin film encapsulation layer 451, an organic thin film encapsulation layer 452, and a second inorganic thin film encapsulation layer 453.

As described above, because the organic light emitting display device 100 includes the pixel regions 10 including the first sub-pixel region 11, the second sub-pixel region 12, and the third sub-pixel region 13, and the connection regions 30, the substrate 110 may also be divided into the pixel regions 10 including the first sub-pixel region 11, the second sub-pixel region 12, and the third sub-pixel region 13, and the connection regions 30. In addition, except for the connection part 120, a remaining portion of the substrate 110 shown in FIG. 5 may correspond to the display part 520, and an empty space between the display parts 520 shown in FIG. 6 may correspond to the through-opening 205.

The first organic film layer 111 may be provided. The first organic film layer 111 may include an organic material having flexibility. For example, the first organic film layer 111 may include a random copolymer or a block copolymer. In addition, the first organic film layer 111 may have high transparency, a low coefficient of thermal expansion, and a high glass transition temperature. Because the first organic film layer 111 may include an imide group, heat resistance, chemical resistance, abrasion resistance, and electrical properties thereof may be improved (e.g., may be excellent). In one or more embodiments, the first organic film layer 111 may include polyimide.

The first barrier layer 112 may be disposed on the first organic film layer 111 at (e.g., in or on) the pixel region 10 and the connection region 30. In other words, the first barrier layer 112 may be disposed over the entire first organic film layer 111. The first barrier layer 112 may block or substantially block moisture infiltrating through the first organic film layer 111. The first barrier layer 112 may include an inorganic material having flexibility. In one or more embodiments, the first barrier layer 112 may include a silicon compound, a metal oxide, or the like. For example, the first barrier layer 112 may include silicon oxide ($SiO_x$), silicon nitride ($SiN_x$), silicon oxynitride ($SiO_xN_y$), silicon oxycarbide ($SiO_xC_y$), silicon carbonitride ($SiC_xN_y$), aluminum oxide ($AlO_x$), aluminum nitride ($AlN_x$), tantalum oxide ($TaO_x$), hafnium oxide ($HfO_x$), zirconium oxide ($ZrO_x$), titanium oxide ($TiO_x$), and/or the like.

The second organic film layer 113 may be disposed on the first barrier layer 112 at (e.g., in or on) the pixel region 10 and the connection region 30. In other words, the second organic film layer 113 may be disposed over the entire first barrier layer 112. The second organic film layer 113 may include an organic material having flexibility. For example, the second organic film layer 113 may include a random copolymer or a block copolymer. In one or more embodiments, the second organic film layer 113 may include polyimide.

The second barrier layer 114 may be disposed on the second organic film layer 113 at (e.g., in or on) the pixel region 10 and the connection region 30. In other words, the second barrier layer 114 may be disposed over the entire second organic film layer 113. The second barrier layer 114 may block or substantially block moisture infiltrating through the second organic film layer 113. The second barrier layer 114 may include an inorganic material having flexibility. In one or more embodiments, the second barrier layer 114 may include silicon oxide, silicon nitride, or the like.

Accordingly, the substrate 110 including the first organic film layer 111, the first barrier layer 112, the second organic film layer 113, and the second barrier layer 114 may be provided.

Although the substrate 110 has been described as having four layers, the configuration of the substrate 110 according to one or more embodiments of the present disclosure is not limited thereto. For example, the substrate 110 may include a single layer, or at least two layers.

In other embodiments, the substrate 110 may include a transparent material or an opaque material. For example, the substrate 110 may include a quartz substrate, a synthetic quartz substrate, a calcium fluoride substrate, a fluorine-doped quartz (F-doped quartz) substrate, a soda lime glass substrate, a non-alkali glass substrate, and/or the like.

The buffer layer 115 may be disposed on the substrate 110 at (e.g., in or on) the pixel region 10 and the connection region 30. In other words, the buffer layer 115 may be disposed over the entire substrate 110. The buffer layer 115 may prevent or substantially prevent metal atoms and/or impurities from diffusing from the substrate 110 into an upper structure, and may control a heat transfer rate during a crystallization process for forming the active layer 130 to obtain a uniform or substantially uniform active layer 130. In addition, when a surface of the substrate 110 is not uniform or substantially uniform, the buffer layer 115 may serve to improve a flatness of the surface of the substrate 110. Depending on a kind of the substrate 110, at least two buffer layers 115 may be provided on the substrate 110, or the buffer layer 115 may not be provided (e.g., may be omitted). The buffer layer 115 may include an organic insulating material or an inorganic insulating material. In one or more embodiments, the buffer layer 115 may include an inorganic insulating material, and may block or substantially block moisture that may infiltrate through the substrate 110.

The active layer 130 may be disposed on the buffer layer 115 at (e.g., in or on) the pixel region 10. The active layer 130 may include a metal oxide semiconductor, an inorganic semiconductor (e.g., an amorphous silicon semiconductor or a poly silicon semiconductor), an organic semiconductor, or the like. The active layer 130 may have a source region and a drain region.

The gate insulating layer 150 may be disposed on the buffer layer 115 and on the active layer 130 at (e.g., in or on) the pixel region 10 and the connection region 30. In other words, the gate insulating layer 150 may be disposed over the entire buffer layer 115. For example, the gate insulating layer 150 may sufficiently cover the active layer 130, and may have a flat or substantially flat top surface without creating a step around the active layer 130. As another example, the gate insulating layer 150 may be disposed along a profile of the active layer 130 with a uniform or substantially uniform thickness to cover the active layer 130 on the buffer layer 115. The gate insulating layer 150 may include a silicon compound, a metal oxide, or the like. In other embodiments, the gate insulating layer 150 may have a multilayered structure including a plurality of insulating layers. For example, the insulating layers may have mutually different thicknesses from each other, or may include mutually different materials from each other.

The gate electrode 170 may be disposed on the gate insulating layer 150 at (e.g., in or on) the pixel region 10. In other words, the gate electrode 170 may be disposed on a portion of the gate insulating layer 150 under which the active layer 130 is located. The gate electrode 170 may include a metal, a metal alloy, a metal nitride, a conductive metal oxide, a transparent conductive material, and/or the like. For example, the gate electrode 170 may include gold (Au), silver (Ag), aluminum (Al), platinum (Pt), nickel (Ni), titanium (Ti), palladium (Pd), magnesium (Mg), calcium (Ca), lithium (Li), chromium (Cr), tantalum (Ta), tungsten (W), copper (Cu), molybdenum (Mo), scandium (Sc), neodymium (Nd), iridium (Ir), an aluminum-containing alloy, aluminum nitride ($AlN_x$), a silver-containing alloy, tungsten nitride ($WN_x$), a copper-containing alloy, a molybdenum-containing alloy, titanium nitride ($TiN_x$), chromium nitride ($CrN_x$), tantalum nitride ($TaN_x$), strontium ruthenium oxide ($SrRu_xO_y$), zinc oxide ($ZnO_x$), indium tin oxide (ITO), tin oxide ($SnO_x$), indium oxide ($InO_x$), gallium oxide ($GaO_x$), indium zinc oxide (IZO), and/or the like. These materials may be used alone or in combination with each other. In other embodiments, the gate electrode 170 may have a multilayered structure including a plurality of metal layers. For example, the metal layers may have mutually different thicknesses from each other, or may include mutually different materials from each other.

The interlayer insulating layer 190 may be disposed on the gate insulating layer 150 and the gate electrode 170 at (e.g., in or on) the pixel region 10 and the connection region 30. In other words, the interlayer insulating layer 190 may be disposed over the entire gate insulating layer 150. For example, the interlayer insulating layer 190 may sufficiently cover the gate electrode 170 on the gate insulating layer 150 at (e.g., in or on) the pixel region 10, and may have a flat or substantially flat top surface without creating a step around the gate electrode 170. As another example, the interlayer insulating layer 190 may be disposed along a profile of the gate electrode 170 with a uniform or substantially uniform thickness to cover the gate electrode 170 on the gate insulating layer 150. The interlayer insulating layer 190 may include a silicon compound, a metal oxide, or the like. In other embodiments, the interlayer insulating layer 190 may have a multilayered structure including a plurality of insulating layers. For example, the insulating layers may have mutually different thicknesses from each other, or may include mutually different materials from each other.

The source electrode 210 and the drain electrode 230 may be disposed on the interlayer insulating layer 190 at (e.g., in or on) the pixel region 10. The source electrode 210 may be connected to the source region of the active layer 130 through a contact hole formed by removing first portions of the gate insulating layer 150 and the interlayer insulating layer 190, and the drain electrode 230 may be connected to the drain region of the active layer 130 through a contact hole formed by removing second portions of the gate insulating layer 150 and the interlayer insulating layer 190. Each of the source electrode 210 and the drain electrode 230 may include a metal, a metal alloy, a metal nitride, a conductive metal oxide, a transparent conductive material, and/or the like. These materials may be used alone or in combination with each other. In other embodiments, each of the source electrode 210 and the drain electrode 230 may have a multilayered structure including a plurality of metal layers. For example, the metal layers may have mutually different thicknesses from each other, or may include mutually different materials from each other.

Accordingly, the semiconductor element 250 including the active layer 130, the gate electrode 170, the source electrode 210, and the drain electrode 230 may be provided. For example, the organic light emitting display device 100 may include a plurality of semiconductor elements 250, and at least one semiconductor element 250 may be disposed at (e.g., in or on) each of the first sub-pixel region 11, the second sub-pixel region 12, and the third sub-pixel region 13.

Although one transistor (e.g., the semiconductor element 250) has been described as being disposed at (e.g., in or on) each of the first to third sub-pixel regions 11, 12, and 13, the configuration of the first to third sub-pixel regions 11, 12, and 13 according to one or more embodiments of the present disclosure is not limited thereto. For example, each of the first to third sub-pixel regions 11, 12, and 13 may have a configuration including at least two transistors, and at least one capacitor.

In addition, although the semiconductor element 250 has been described as having a top gate structure, the configuration of the semiconductor element 250 according to one or more embodiments of the present disclosure is not limited thereto. For example, the semiconductor element 250 may have a bottom gate structure, and/or a double gate structure.

The planarization layer 270 may be disposed on the interlayer insulating layer 190, the source electrode 210, and the drain electrode 230 at (e.g., in or on) the pixel region 10 and the connection region 30. In other words, the planarization layer 270 may be disposed over the entire interlayer insulating layer 190. For example, the planarization layer 270 may have a relatively thick thickness to sufficiently cover the source and drain electrodes 210 and 230 on the interlayer insulating layer 190. In this case, the planarization layer 270 may have a flat or substantially flat top surface. In order to implement such a flat or substantially flat top surface of the planarization layer 270, a planarization process may be additionally performed on the planarization layer 270. In addition, the planarization layer 270 may have a contact hole that exposes a top surface of the drain electrode 230. The planarization layer 270 may include an organic material or an inorganic material. In one or more embodiments, the planarization layer 270 may include an organic insulating material.

The lower electrode 290 may be disposed on the planarization layer 270 at (e.g., in or on) the pixel region 10. The lower electrode 290 may contact (e.g., may make direct contact with) the drain electrode 230 through the contact hole in the planarization layer 270, and the lower electrode 290 may be electrically connected to the semiconductor element 250. The lower electrode 290 may include a metal, a metal alloy, a metal nitride, a conductive metal oxide, a transparent conductive material, and/or the like. These materials may be used alone or in combination with each other. In other embodiments, the lower electrode 290 may have a multilayered structure including a plurality of metal layers. For example, the metal layers may have mutually different thicknesses from each other, or may include mutually different materials from each other.

The pixel defining layer 310 may be disposed on the planarization layer 270 at (e.g., in or on) the pixel region 10. In other words, the pixel defining layer 310 may be disposed on a part of the lower electrode 290, and on a part of the planarization layer 270. The pixel defining layer 310 may cover opposite side portions (e.g., opposite edge portions) of the lower electrode 290, and may have an opening that exposes a part of a top surface of the lower electrode 290. In some embodiments, the pixel defining layer 310 may also be disposed on the planarization layer 270 at (e.g., in or on) the connection region 30. The pixel defining layer 310 may be formed of an organic material or an inorganic material. In one or more embodiments, the pixel defining layer 310 may include an organic insulating material.

The spacer 390 may be disposed on the pixel defining layer 310 at (e.g., in or on) the pixel region 10. The spacer 390 may perform a function of supporting a metal mask. The spacer 390 may include an organic material or an inorganic material.

The light emitting layer 330 may be disposed on the lower electrode 290 at (e.g., in or on) the pixel region 10. In other words, the light emitting layer 330 may be disposed on the lower electrode 290 that is exposed by the opening of the pixel defining layer 310. The light emitting layer 330 may be formed by using at least one of various suitable light emitting materials for emitting different colored lights (e.g., a red light, a green light, a blue light, and/or the like) according to the sub-pixels. As another example, the light emitting layer 330 may be formed by stacking a plurality of light emitting materials for generating different colored lights, for example, such as a red light, a green light, and a blue light, to emit white light as a whole. In this case, a color filter may be disposed on the light emitting layer 330 (e.g., on the thin film encapsulation structure 450 to overlap with the light emitting layer 330). The color filter may include at least one of a red color filter, a green color filter, and/or a blue color filter. In some embodiments, the color filter may include a yellow color filter, a cyan color filter, and a magenta color filter. The color filter may include a photosensitive resin or a color photoresist.

The upper electrode 340 may be disposed on the planarization layer 270, the pixel defining layer 310, the spacer 390, and the light emitting layer 330 at (e.g., in or on) the pixel region 10 and the connection region 30. In other words, the upper electrode 340 may be disposed over the entire substrate 110. In some embodiments, the upper electrode 340 may be disposed at (e.g., in or on) the pixel region 10 on the planarization layer 270, without being disposed at (e.g., in or on) the connection region on the planarization layer 270. The upper electrode 340 may include a metal, a metal alloy, a metal nitride, a conductive metal oxide, a transparent conductive material, and/or the like. These materials may be used alone or in combination with each other. In other embodiments, the upper electrode 340 may have a multilayered structure including a plurality of metal layers. For example, the metal layers may have mutually different thicknesses from each other, or may include mutually different materials from each other.

Accordingly, the sub-pixel structure 200 including the lower electrode 290, the light emitting layer 330, and the upper electrode 340 may be provided. For example, the organic light emitting display device 100 may include a plurality of lower electrodes 290, and a plurality of light emitting layers 330. In this case, one lower electrode 290 and one light emitting layer 330 may be disposed at (e.g., in or on) each of the first to third sub-pixel regions 11, 12, and 13, and the upper electrode 340 may be disposed on the plurality of lower electrodes 290 and the plurality of light emitting layers 330.

The first inorganic thin film encapsulation layer 451 may be disposed on the upper electrode 340 over the entirety of the pixel region 10 and the connection region 30. In other words, the first inorganic thin film encapsulation layer 451 may be disposed on the upper electrode 340, a side wall of the substrate 110, a side wall of the buffer layer 115, a side wall of the gate insulating layer 150, a side wall of the interlayer insulating layer 190, and a side wall of the planarization layer 270. As shown in FIG. 6, the side walls of these layers may be adjacent to the through-opening 205. The first inorganic thin film encapsulation layer 451 may be disposed along a profile of the upper electrode 340 and the side wall of each of the substrate 110, the buffer layer 115, the gate insulating layer 150, the interlayer insulating layer 190, and the planarization layer 270 with a uniform or substantially uniform thickness, to cover the upper electrode 340 and the side wall of each of the substrate 110, the buffer layer 115, the gate insulating layer 150, the interlayer insulating layer 190, and the planarization layer 270. In other words, the first inorganic thin film encapsulation layer 451 may extend in a direction from the sub-pixel structure 200 located under the first inorganic thin film encapsulation layer 451 to the through-opening 205, and may be disposed between the side wall of the substrate 110 that is adjacent to the through-opening 205 and the organic pattern 454.

In one or more embodiments, the first inorganic thin film encapsulation layer 451 may completely cover the side wall of each of the substrate 110, the buffer layer 115, the gate insulating layer 150, the interlayer insulating layer 190, and the planarization layer 270. In addition, the first inorganic thin film encapsulation layer 451 may extend in a direction opposite to the third direction D3 on the side wall of each of the substrate 110, the buffer layer 115, the gate insulating layer 150, the interlayer insulating layer 190, and the planarization layer 270, and may have a protrusion protruding from a portion of the first inorganic thin film encapsulation layer 451 that is adjacent to a bottom surface of the substrate 110 (e.g., adjacent to a bottom surface of the first organic film layer 111) in a direction from the side wall of the substrate 110 to the through-opening 205.

The first inorganic thin film encapsulation layer 451 may prevent or substantially prevent the sub-pixel structure 200 from deteriorating due to infiltration of moisture, oxygen, and/or the like. In addition, the first inorganic thin film encapsulation layer 451 may also perform a function of protecting the sub-pixel structure 200 from an external impact. The first inorganic thin film encapsulation layer 451 may include one or more inorganic insulating materials having flexibility.

The organic thin film encapsulation layer 452 may be disposed on the first inorganic thin film encapsulation layer 451 at (e.g., in or on) the pixel region 10. The organic thin film encapsulation layer 452 may improve a flatness of the organic light emitting display device 100, and may protect the sub-pixel structure 200 together with the first inorganic thin film encapsulation layer 451. The organic thin film encapsulation layer 452 may include one or more organic materials having flexibility. In some embodiments, the organic thin film encapsulation layer 452 may be disposed on the first inorganic thin film encapsulation layer 451 at (e.g., in or on) the connection region 30.

The organic pattern 454 may be disposed on the side wall of the substrate 110 adjacent to the through-opening 205. In other words, the organic pattern 454 may be disposed on the protrusion of the first inorganic thin film encapsulation layer 451. In one or more embodiments, in a plan view of the organic light emitting display device 100, the organic pattern 454 may be disposed along an outermost periphery of a region defined by the adjacent pixel regions 10 from among the pixel regions 10, and on the connection regions 30 configured to connect the adjacent pixel regions 10 to each other. In other words, the organic pattern 454 may be disposed on the protrusion of the first inorganic thin film encapsulation layer 451 along a profile of an outermost periphery of the through-opening 205. For example, a bottom surface of the organic pattern 454 may contact (e.g., may make contact with) the protrusion of the first inorganic thin film encapsulation layer 451, a top surface of the organic pattern 454 may contact (e.g., may make contact with) the second inorganic thin film encapsulation layer 453, a first side surface of the organic pattern 454 may contact (e.g., may make contact with) the first inorganic thin film encapsulation layer 451, and a second side surface (e.g., opposite the first side surface) of the organic pattern 454 may be exposed.

The organic pattern 454 may include one or more organic insulating materials having flexibility. In one or more embodiments, the organic pattern 454 may include the same or substantially the same material as that of the organic thin film encapsulation layer 452. For example, the organic pattern 454 may include a photoresist, acryl, polyacryl, polyimide, polyamide, epoxy, acrylate monomer, phenylacetylene, diamine, dianhydride, siloxane, polysiloxane, silane, parylene, olefin-based polymer (polyethylene or polypropylene), polyethylene terephthalate, fluorine, and/or the like. In some embodiments, the organic pattern 454 may include a resin including the organic insulating material as a base material.

The second inorganic thin film encapsulation layer 453 may be disposed on the first inorganic thin film encapsulation layer 451 and the organic thin film encapsulation layer 452 over an entire area of the pixel region 10 and the connection region 30. The second inorganic thin film encapsulation layer 453 may be disposed along a profile of the first inorganic thin film encapsulation layer 451 and the organic thin film encapsulation layer 452 with a uniform or substantially uniform thickness to cover the organic thin film encapsulation layer 452. In other words, the second inorganic thin film encapsulation layer 453 may extend in the direction from the sub-pixel structure 200 located under the second inorganic thin film encapsulation layer 453 to the through-opening 205, and may be disposed on the first inorganic thin film encapsulation layer 451 and the organic pattern 454 disposed on the side wall of the substrate 110 that is adjacent to the through-opening 205. The second inorganic thin film encapsulation layer 453 may prevent or substantially prevent the sub-pixel structure 200 from deteriorating due to the infiltration of moisture, oxygen, and/or the like together with the first inorganic thin film encapsulation layer 451. In addition, the second inorganic thin film encapsulation layer 453 may also perform a function of protecting the sub-pixel structure 200 from an external impact together with the first inorganic thin film encapsulation layer 451 and the organic thin film encapsulation layer 452. The second inorganic thin film encapsulation layer 453 may include the one or more inorganic insulating materials having flexibility.

Accordingly, the thin film encapsulation structure 450 including the first inorganic thin film encapsulation layer 451, the organic thin film encapsulation layer 452, and the second inorganic thin film encapsulation layer 453 may be provided.

In other embodiments, the thin film encapsulation structure 450 may have a five-layer structure in which three inorganic thin film encapsulation layers and two organic thin film encapsulation layers are stacked on one another, or a seven-layer structure in which four inorganic thin film encapsulation layers and three organic thin film encapsulation layers are stacked on one another.

As described above, the organic light emitting display device 100 including the substrate 110, the buffer layer 115, the semiconductor element 250, the gate insulating layer 150, the interlayer insulating layer 190, the planarization layer 270, the sub-pixel structure 200, the pixel defining layer 310, the spacer 390, the thin film encapsulation structure 450, and the organic pattern 454 may be provided.

As a comparative example, during a process of peeling a substrate from a glass substrate in a method of manufacturing a comparative organic light emitting display device, a second inorganic thin film encapsulation layer may be excessively torn off on a side wall of the substrate, so that only a first inorganic thin film encapsulation layer may remain on the side wall of the substrate. In this case, a path for blocking permeation of water and/or moisture that may infiltrate from the outside may be relatively shortened at the side wall of the substrate, which may cause the infiltration of the water and/or moisture into the substrate. Accordingly, a defect may be caused in the comparative organic light emitting display device.

According to one or more embodiments of the present disclosure, the organic light emitting display device 100 includes the first inorganic thin film encapsulation layer 451 and the second inorganic thin film encapsulation layer 453 that completely cover the side wall of each of the substrate 110, the buffer layer 115, the gate insulating layer 150, the interlayer insulating layer 190, and the planarization layer 270, so that water and/or moisture that may infiltrate into the side walls from the outside through the through-opening 205 may be blocked or substantially blocked (e.g., may be completely blocked).

In addition, because the organic pattern 454 may be disposed on the side wall of the substrate 110 adjacent to the through-opening 205, a path for blocking permeation of water and/or moisture may be relatively increased at the side wall of the substrate 110.

FIGS. 7 to 22 are views showing a method of manufacturing an organic light emitting display device according to one or more embodiments of the present disclosure.

Figure 7:
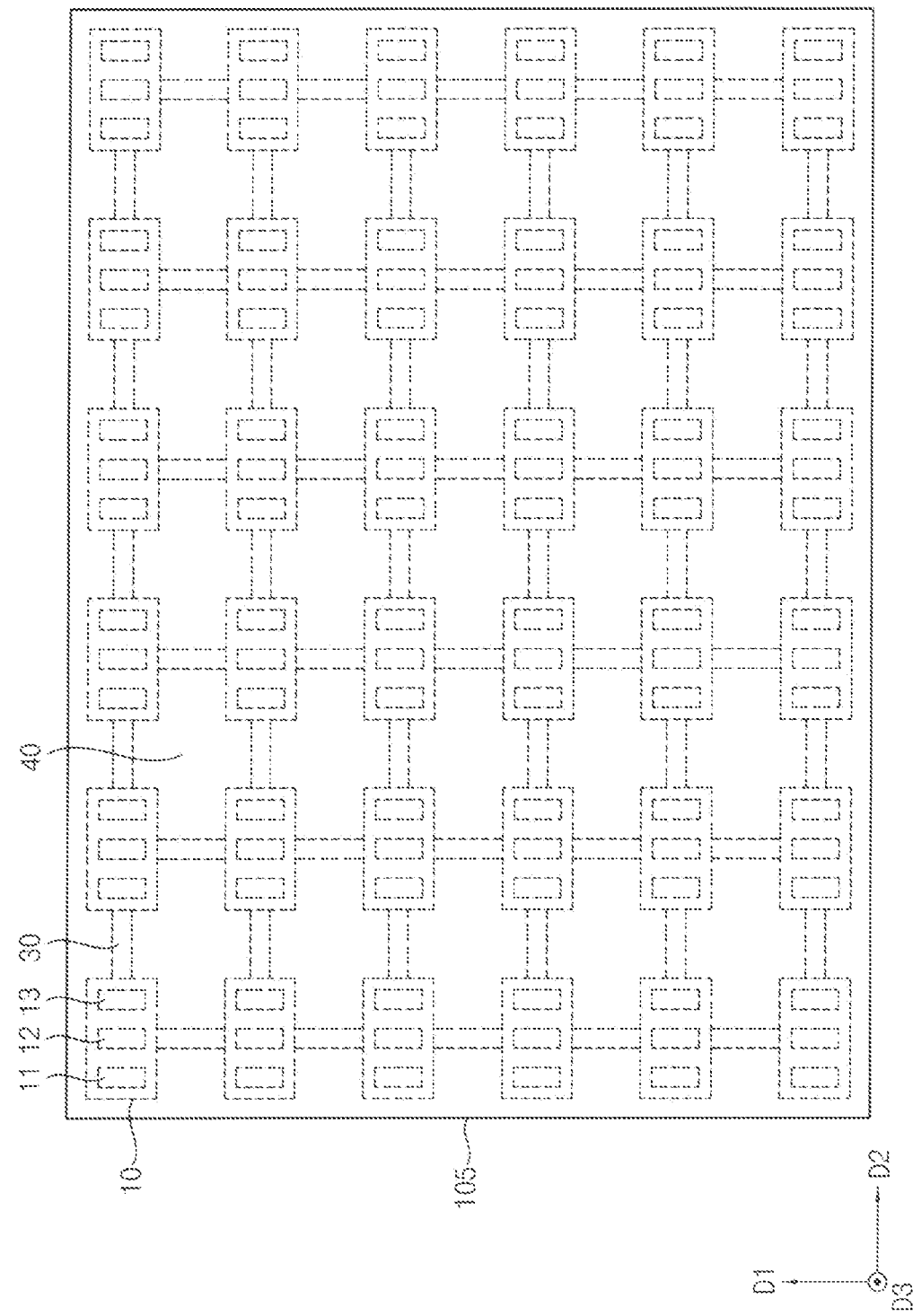
Figure 8:
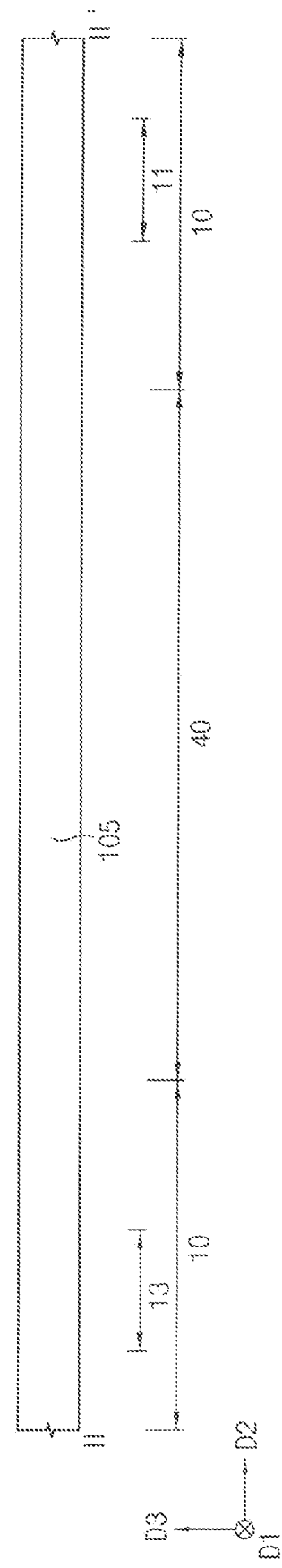

Referring to FIGS. 7 and 8, a rigid glass substrate 105 may be provided. The glass substrate 105 may include the pixel regions 10, the connection regions 30, and contact regions 40. In this case, one pixel region 10 from among the pixel regions 10 may include the first sub-pixel region 11, the second sub-pixel region 12, and the third sub-pixel region 13.

The pixel regions 10 may be arranged in the first direction D1 and the second direction D2. The pixel regions 10 may be spaced apart from each other, and the connection regions 30 may be located between adjacent pixel regions 10, respectively, from among the pixel regions 10. In other words, one connection region 30 may be located between two adjacent pixel regions 10 from among the pixel regions 10. In addition, one contact region 40 from among the contact regions 40 may correspond to a region defined by the adjacent pixel regions 10 from among the pixel regions 10, and the connection regions 30 located between the adjacent pixel regions 10, respectively. In other words, one contact region 40 from among the contact regions 40 may be surrounded (e.g., around a periphery thereof) by at least four adjacent pixel regions 10 from among the pixel regions 10, and at least four connection regions 30 configured to connect the at least four adjacent pixel regions 10 to one another.

Figure 9:
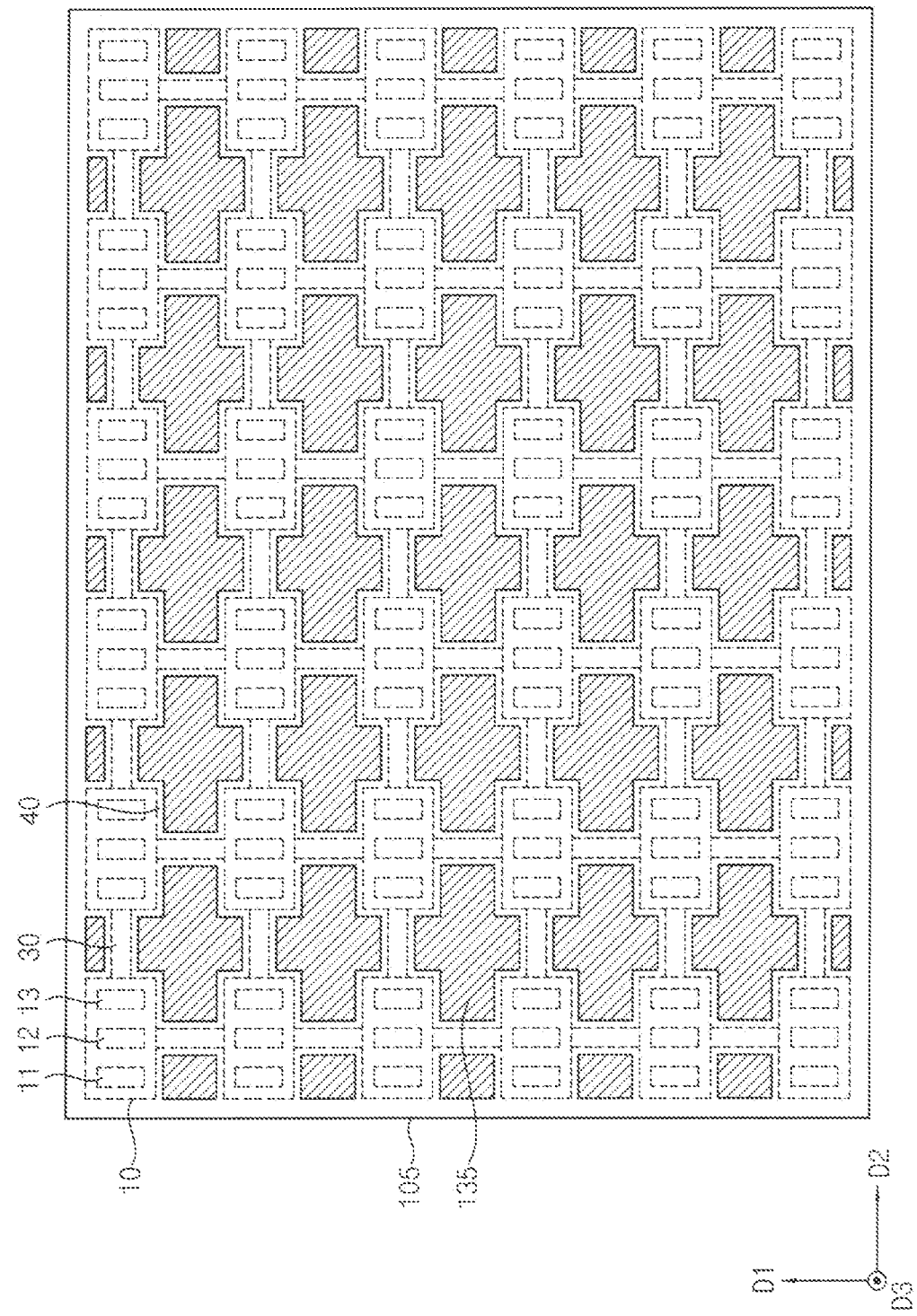
Figure 10:
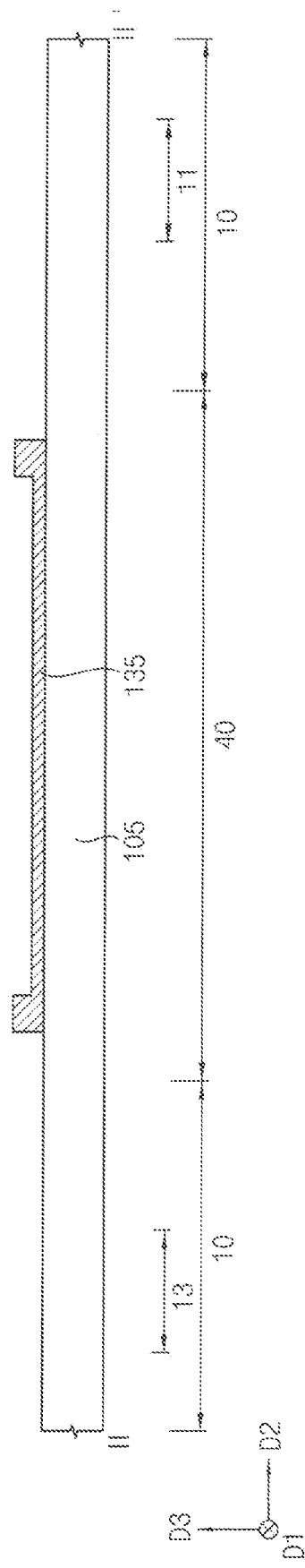

Referring to FIGS. 9 and 10, a contact pattern 135 may be formed on the glass substrate 105 at (e.g., in or on) the contact region 40. The contact pattern 135 may include a protrusion that protrudes in the third direction D3 from a top surface of the contact pattern 135 at an outermost peripheral portion thereof. The contact pattern 135 may be formed by using amorphous silicon. For example, the contact pattern 135 may be formed by using a material having a relatively high adhesive strength with respect to a preliminary first organic film layer 511 that will be described in more detail below. In some embodiments, the contact pattern 135 may be formed by using a metal, a metal alloy, a metal nitride, a conductive metal oxide, a transparent conductive material, or the like.

Figure 11:
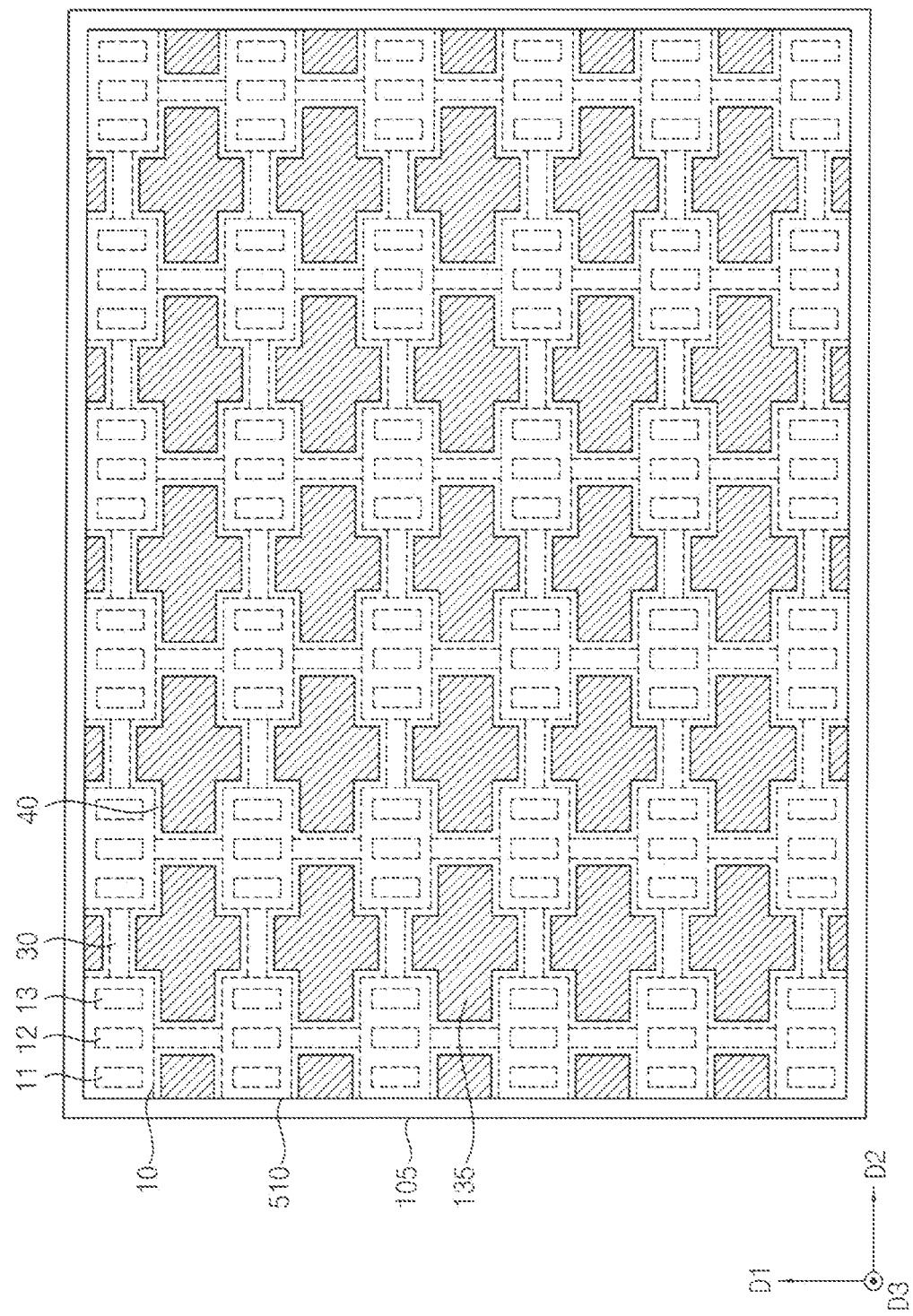
Figure 12:
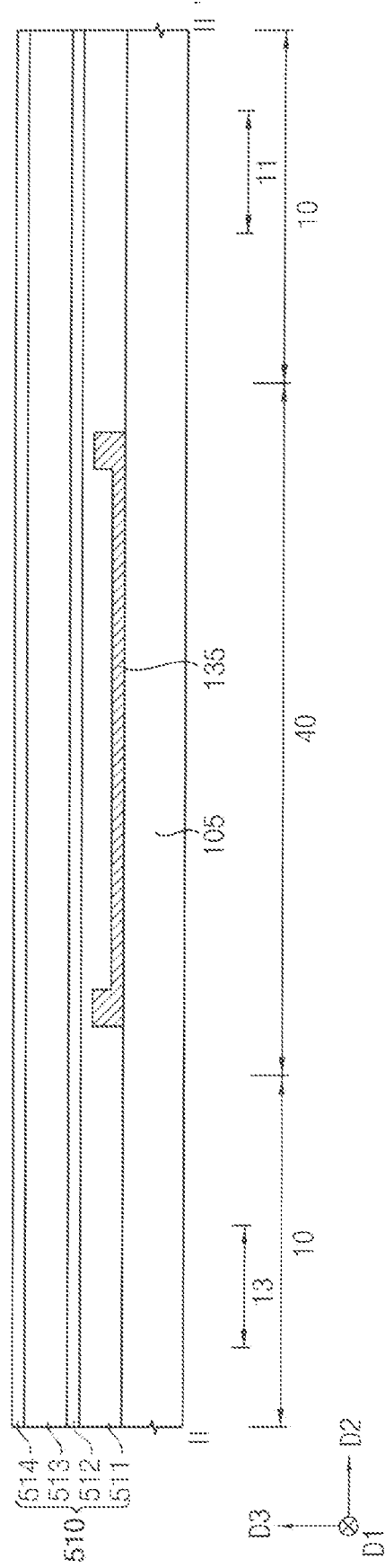

Referring to FIGS. 11 and 12, the preliminary first organic film layer 511 may be formed on the glass substrate 105 and the contact pattern 135 at (e.g., in or on) the pixel region 10, the connection region 30, and the contact region 40. In other words, the preliminary first organic film layer 511 may be formed over the entire glass substrate 105. The preliminary first organic film layer 511 may be formed by using an organic material having flexibility. For example, the preliminary first organic film layer 511 may include a random copolymer or a block copolymer. In addition, the preliminary first organic film layer 511 may have high transparency, a low coefficient of thermal expansion, and a high glass transition temperature. Because the preliminary first organic film layer 511 includes an imide group, heat resistance, chemical resistance, abrasion resistance, and electrical properties thereof may be improved (e.g., may be excellent). In one or more embodiments, the preliminary first organic film layer 511 may include polyimide.

A preliminary first barrier layer 512 may be formed on the preliminary first organic film layer 511 at (e.g., in or on) the pixel region 10, the connection region 30, and the contact region 40. In other words, the preliminary first barrier layer 512 may be formed over the entire preliminary first organic film layer 511. The preliminary first barrier layer 512 may block or substantially block moisture infiltrating through the preliminary first organic film layer 511. The preliminary first barrier layer 512 may be formed by using an inorganic material having flexibility. In one or more embodiments, the preliminary first barrier layer 512 may include a silicon compound, a metal oxide, or the like. For example, the preliminary first barrier layer 512 may include silicon oxide, silicon nitride, silicon oxynitride, silicon oxycarbide, silicon carbonitride, aluminum oxide, aluminum nitride, tantalum oxide, hafnium oxide, zirconium oxide, titanium oxide, and/or the like.

A preliminary second organic film layer 513 may be formed on the preliminary first barrier layer 512 at (e.g., in or on) the pixel region 10, the connection region 30, and the contact region 40. In other words, the preliminary second organic film layer 513 may be formed over the entire preliminary first barrier layer 512. The preliminary second organic film layer 513 may be formed by using an organic material having flexibility. For example, the preliminary second organic film layer 513 may include a random copolymer or a block copolymer. In one or more embodiments, the preliminary second organic film layer 513 may include polyimide.

A preliminary second barrier layer 514 may be formed on the preliminary second organic film layer 513 at (e.g., in or on) the pixel region 10, the connection region 30, and the contact region 40. In other words, the preliminary second barrier layer 514 may be formed over the entire preliminary second organic film layer 513. The preliminary second barrier layer 514 may block or substantially block moisture infiltrating through the preliminary second organic film layer 513. The preliminary second barrier layer 514 may be formed by using an inorganic material having flexibility. In one or more embodiments, the preliminary second barrier layer 514 may include silicon oxide, silicon nitride, or the like.

Accordingly, a preliminary substrate 510 including the preliminary first organic film layer 511, the preliminary first barrier layer 512, the preliminary second organic film layer 513, and the preliminary second barrier layer 514 may be formed.

Figure 13:
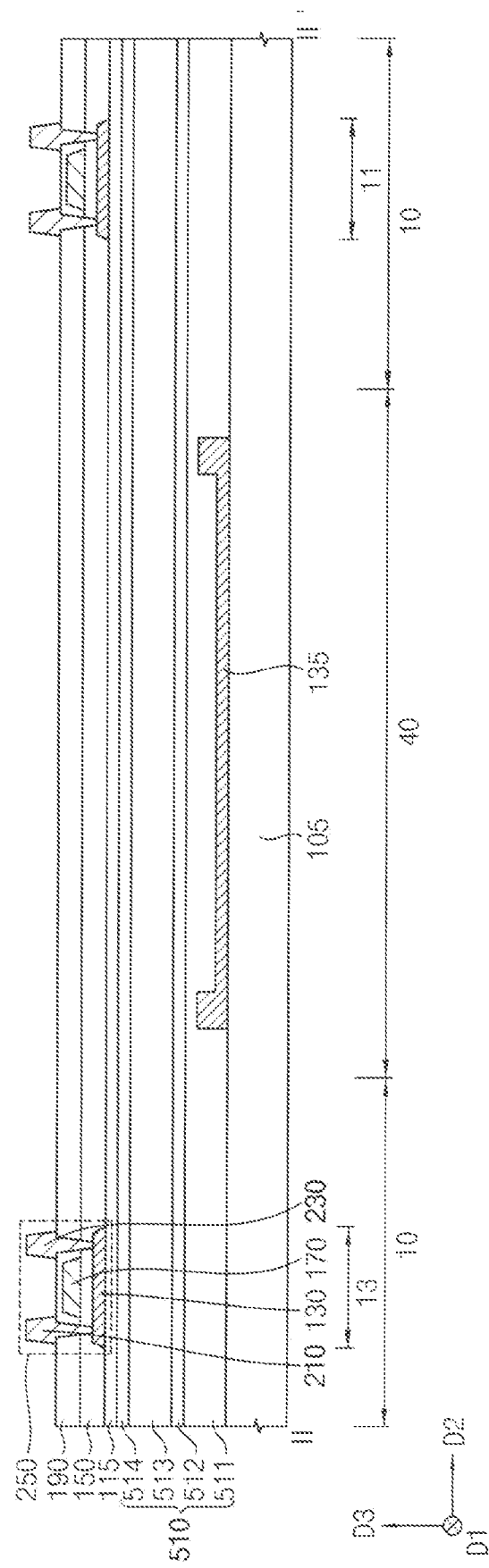

Referring to FIG. 13, the buffer layer 115 may be formed on the preliminary substrate 510 at (e.g., in or on) the pixel region 10, the connection region 30, and the contact region 40. In other words, the buffer layer 115 may be formed over the entire preliminary substrate 510. Depending on a kind of the preliminary substrate 510, at least two buffer layers 115 may be provided on the preliminary substrate 510, or the buffer layer 115 may not be formed (e.g., may be omitted). The buffer layer 115 may be formed by using an inorganic insulating material, and may block or substantially block moisture infiltrating through the preliminary substrate 510.

The active layer 130 may be formed on the buffer layer 115 at (e.g., in or on) the pixel region 10. The active layer 130 may be formed by using a metal oxide semiconductor, an inorganic semiconductor, an organic semiconductor, or the like. The active layer 130 may have a source region and a drain region.

The gate insulating layer 150 may be formed on the buffer layer 115 and the active layer 130 at (e.g., in or on) the pixel region 10, the connection region 30, and the contact region 40. In other words, the gate insulating layer 150 may be formed over the entire buffer layer 115. For example, the gate insulating layer 150 may sufficiently cover the active layer 130, and may have a flat or substantially flat top surface without creating a step around the active layer 130. As another example, the gate insulating layer 150 may be formed along a profile of the active layer 130 with a uniform or substantially uniform thickness to cover the active layer 130 on the buffer layer 115. The gate insulating layer 150 may be formed by using a silicon compound, a metal oxide, or the like. In other embodiments, the gate insulating layer 150 may have a multilayered structure including a plurality of insulating layers. For example, the insulating layers may have mutually different thicknesses from each other, or may include mutually different materials from each other.

The gate electrode 170 may be formed on the gate insulating layer 150 at (e.g., in or on) the pixel region 10. In other words, the gate electrode 170 may be formed on a portion of the gate insulating layer 150 under which the active layer 130 is located. The gate electrode 170 may be formed by using a metal, a metal alloy, a metal nitride, a conductive metal oxide, a transparent conductive material, and/or the like. For example, the gate electrode 170 may include gold, silver, aluminum, platinum, nickel, titanium, palladium, magnesium, calcium, lithium, chromium, tantalum, tungsten, copper, molybdenum, scandium, neodymium, iridium, an aluminum-containing alloy, aluminum nitride, a silver-containing alloy, tungsten nitride, a copper-containing alloy, a molybdenum-containing alloy, titanium nitride, chromium nitride, tantalum nitride, strontium ruthenium oxide, zinc oxide, indium tin oxide, tin oxide, indium oxide, gallium oxide, indium zinc oxide, and/or the like. These materials may be used alone or in combination with each other. In other embodiments, the gate electrode 170 may have a multilayered structure including a plurality of metal layers. For example, the metal layers may have mutually different thicknesses from each other, or may include mutually different materials from each other.

The interlayer insulating layer 190 may be formed on the gate insulating layer 150 and the gate electrode 170 at (e.g., in or on) the pixel region 10, the connection region 30, and the contact region 40. In other words, the interlayer insulating layer 190 may be formed over the entire gate insulating layer 150. For example, the interlayer insulating layer 190 may sufficiently cover the gate electrode 170 at (e.g., in or on) the pixel region 10 on the gate insulating layer 150, and may have a flat or substantially flat top surface without creating a step around the gate electrode 170. As another example, the interlayer insulating layer 190 may be formed along a profile of the gate electrode 170 with a uniform or substantially uniform thickness to cover the gate electrode 170 on the gate insulating layer 150. The interlayer insulating layer 190 may be formed by using a silicon compound, a metal oxide, or the like. In other embodiments, the interlayer insulating layer 190 may have a multilayered structure including a plurality of insulating layers. For example, the insulating layers may have mutually different thicknesses from each other, or may include mutually different materials from each other.

The source electrode 210 and the drain electrode 230 may be formed on the interlayer insulating layer 190 at (e.g., in or on) the pixel region 10. The source electrode 210 may be connected to the source region of the active layer 130 through a contact hole formed by removing first portions of the gate insulating layer 150 and the interlayer insulating layer 190, and the drain electrode 230 may be connected to the drain region of the active layer 130 through a contact hole formed by removing second portions of the gate insulating layer 150 and the interlayer insulating layer 190. Each of the source electrode 210 and the drain electrode 230 may be formed by using a metal, a metal alloy, a metal nitride, a conductive metal oxide, a transparent conductive material, and/or the like. These materials may be used alone or in combination with each other. In other embodiments, each of the source electrode 210 and the drain electrode 230 may have a multilayered structure including a plurality of metal layers. For example, the metal layers may have mutually different thicknesses from each other, or may include mutually different materials from each other.

Accordingly, the semiconductor element 250 including the active layer 130, the gate electrode 170, the source electrode 210, and the drain electrode 230 may be formed.

Figure 14:
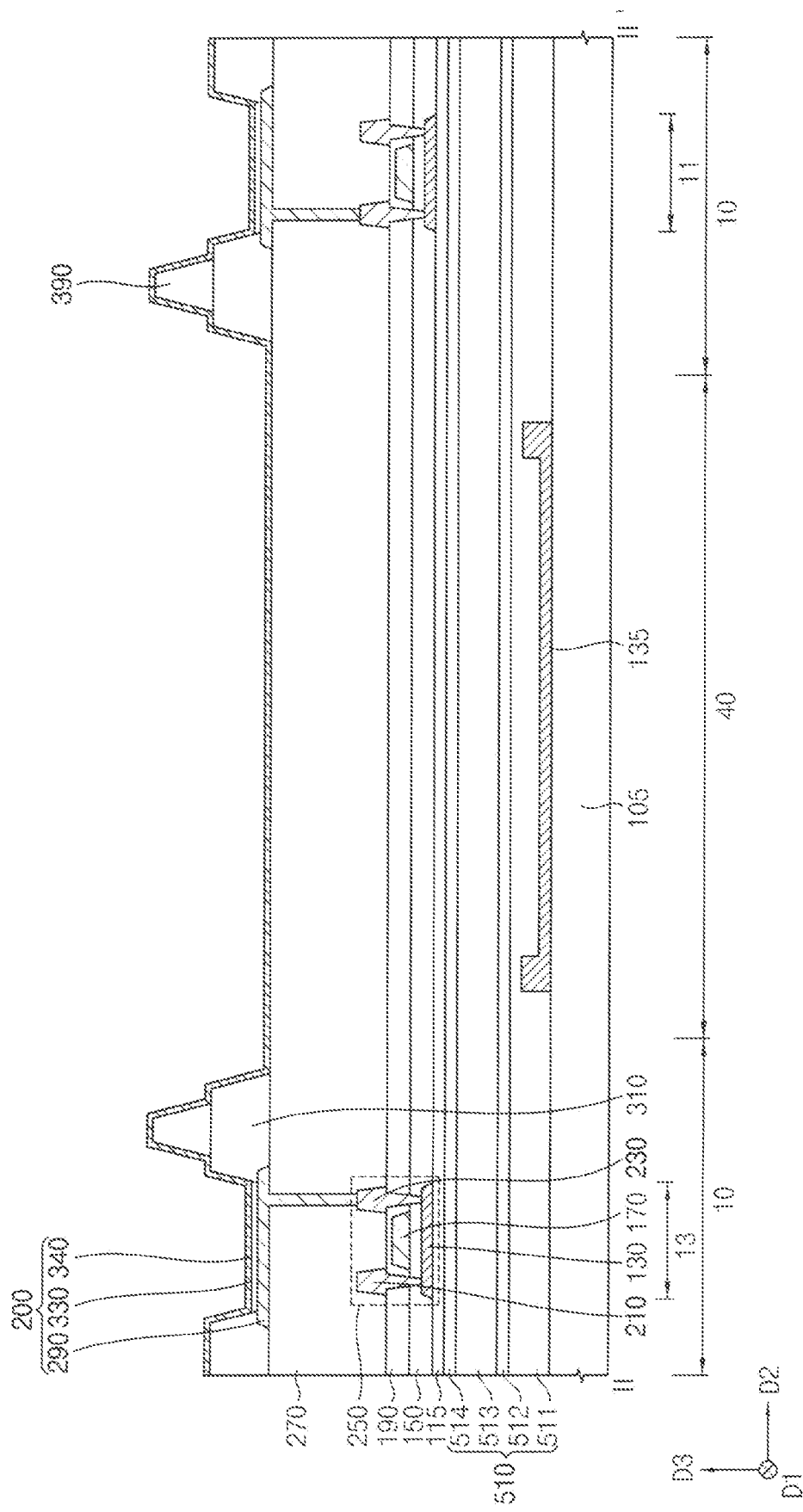

Referring to FIG. 14, the planarization layer 270 may be formed on the interlayer insulating layer 190, the source electrode 210, and the drain electrode 230 at (e.g., in or on) the pixel region 10, the connection region 30, and the contact region 40. In other words, the planarization layer 270 may be formed over the entire interlayer insulating layer 190. For example, the planarization layer 270 may have a relatively thick thickness to sufficiently cover the source and drain electrodes 210 and 230 on the interlayer insulating layer 190. In this case, the planarization layer 270 may have a flat or substantially flat top surface. In order to implement such a flat or substantially flat top surface of the planarization layer 270, a planarization process may be additionally performed on the planarization layer 270. In addition, the planarization layer 270 may have a contact hole that exposes a top surface of the drain electrode 230. The planarization layer 270 may be formed by using an organic insulating material.

The lower electrode 290 may be formed on the planarization layer 270 at (e.g., in or on) the pixel region 10. The lower electrode 290 may contact (e.g., may make direct contact with) the drain electrode 230 through the contact hole of the planarization layer 270. The lower electrode 290 may be formed by using a metal, a metal alloy, a metal nitride, a conductive metal oxide, a transparent conductive material, and/or the like. These materials may be used alone or in combination with each other. In other embodiments, the lower electrode 290 may have a multilayered structure including a plurality of metal layers. For example, the metal layers may have mutually different thicknesses from each other, or may include mutually different materials from each other.

The pixel defining layer 310 may be formed on the planarization layer 270 at (e.g., in or on) the pixel region 10. In other words, the pixel defining layer 310 may be formed on a part of the lower electrode 290, and on a part of the planarization layer 270. The pixel defining layer 310 may cover opposite side portions (e.g., opposite edge portions) of the lower electrode 290, and may have an opening that exposes a part of a top surface of the lower electrode 290. The pixel defining layer 310 may be formed by using an organic insulating material.

The spacer 390 may be formed on the pixel defining layer 310 at (e.g., in or on) the pixel region 10. The spacer 390 may perform a function of supporting a metal mask. The pixel defining layer 310 and the spacer 390 may be concurrently (e.g., simultaneously) formed of the same or substantially the same material by using a halftone slit mask.

The light emitting layer 330 may be formed on the lower electrode 290 at (e.g., in or on) the pixel region 10. In other words, the light emitting layer 330 may be formed on the lower electrode 290 exposed by the opening of the pixel defining layer 310. The light emitting layer 330 may be formed by using at least one of various suitable light emitting materials for emitting different colored lights (e.g., a red light, a green light, a blue light, and/or the like) according to the sub-pixels. As another example, the light emitting layer 330 may be formed by stacking a plurality of light emitting materials for generating different colored lights, for example, such as a red light, a green light, and a blue light, to emit white light as a whole. In this case, a color filter may be formed on the light emitting layer 330. The color filter may include at least one of a red color filter, a green color filter, and/or a blue color filter. In some embodiments, the color filter may include a yellow color filter, a cyan color filter, and a magenta color filter. The color filter may be formed by using a photosensitive resin or a color photoresist.

The upper electrode 340 may be formed on the planarization layer 270, the pixel defining layer 310, the spacer 390, and the light emitting layer 330 at (e.g., in or on) the pixel region 10, the connection region 30, and the contact region 40. In other words, the upper electrode 340 may be formed over the entire preliminary substrate 510. The upper electrode 340 may be formed by using a metal, a metal alloy, a metal nitride, a conductive metal oxide, a transparent conductive material, and/or the like. These materials may be used alone or in combination with each other. In other embodiments, the upper electrode 340 may have a multilayered structure including a plurality of metal layers. For example, the metal layers may have mutually different thicknesses from each other, or may include mutually different materials from each other.

Accordingly, the sub-pixel structure 200 including the lower electrode 290, the light emitting layer 330, and the upper electrode 340 may be formed.

Figure 15:
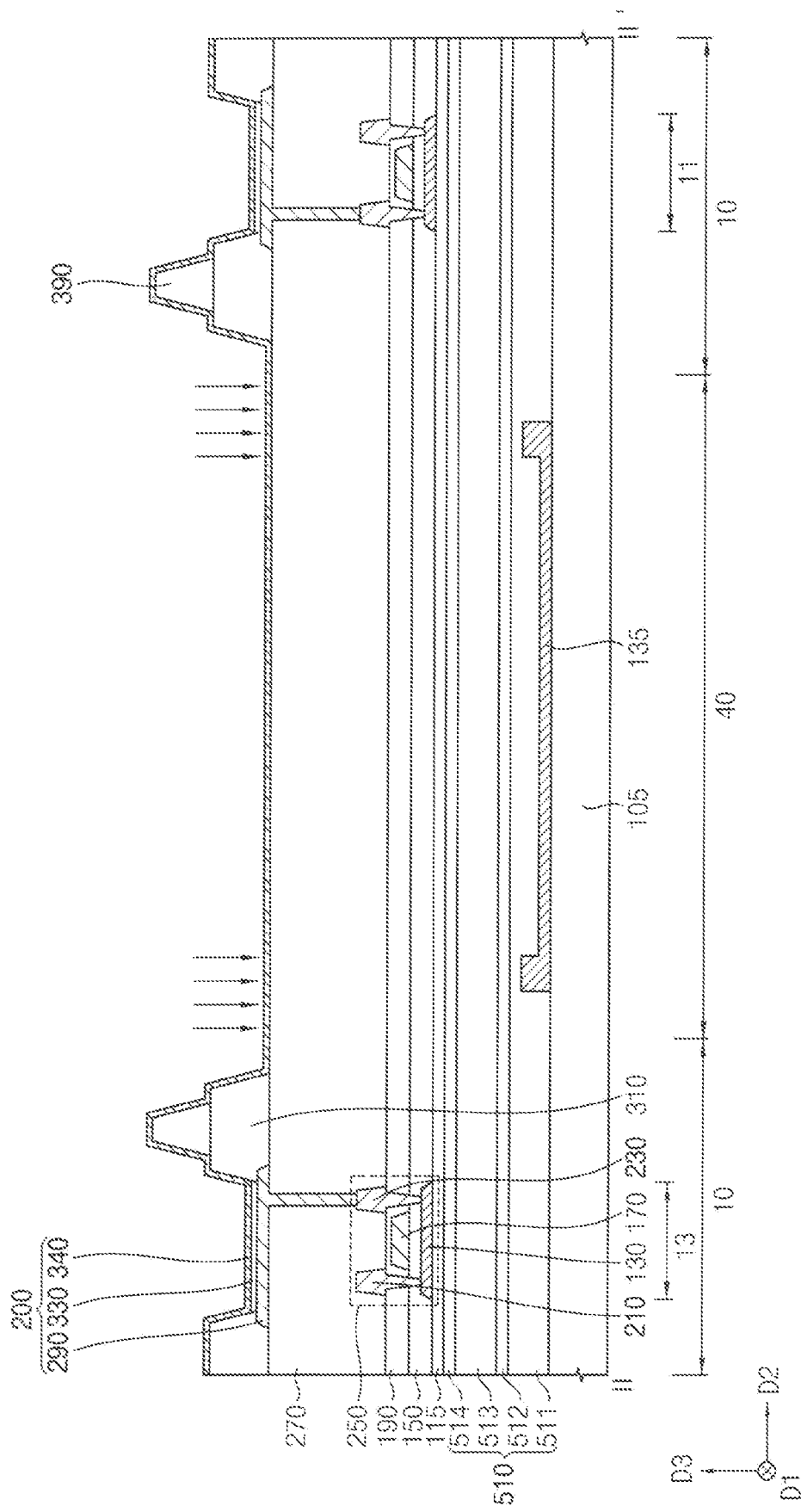

Referring to FIG. 15, a laser may be irradiated onto portions of the preliminary substrate 510, the buffer layer 115, the gate insulating layer 150, the interlayer insulating layer 190, the planarization layer 270, and the upper electrode 340, which overlap with an outermost peripheral portion of the contact region 40.

Figure 16:
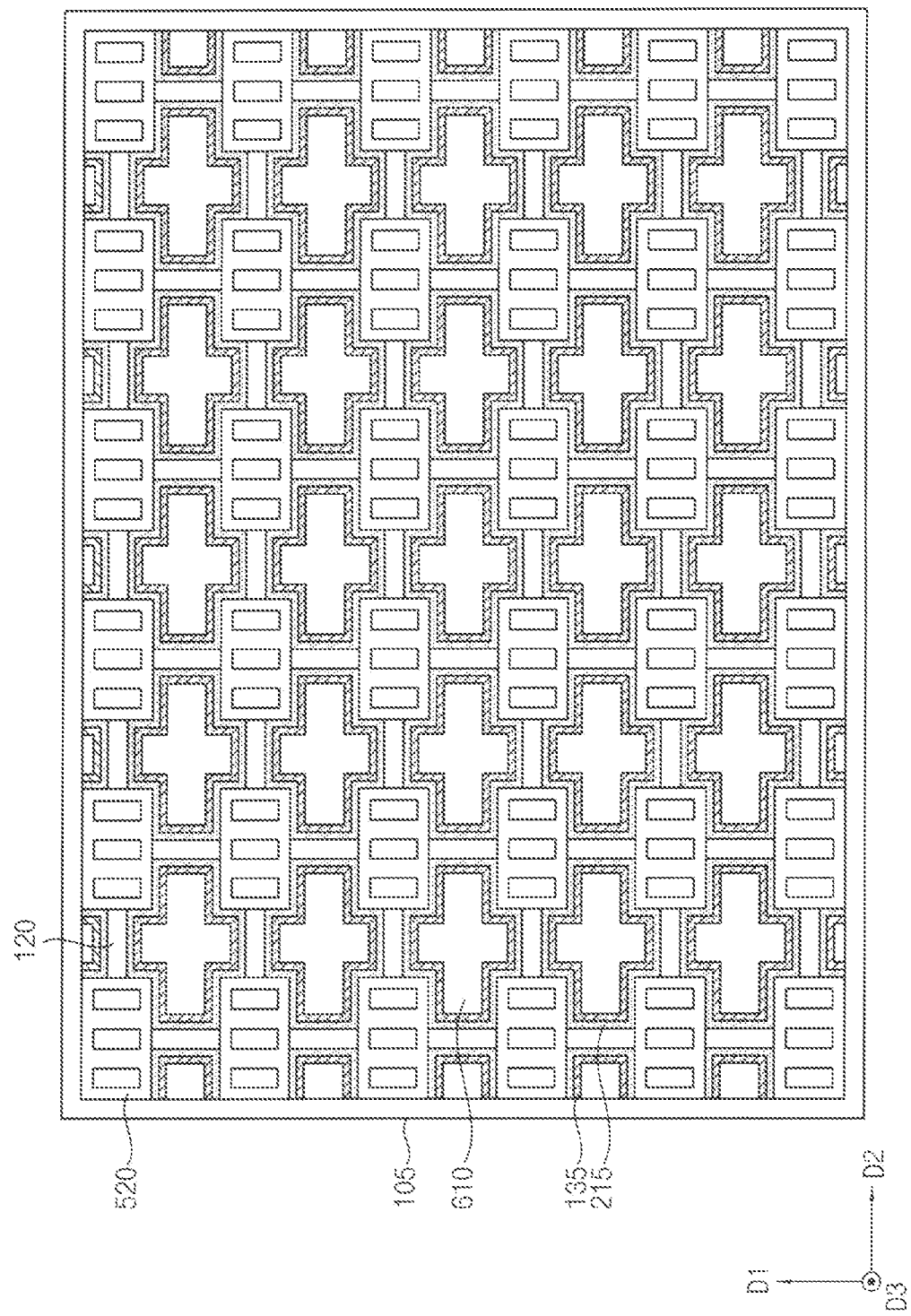
Figure 17:
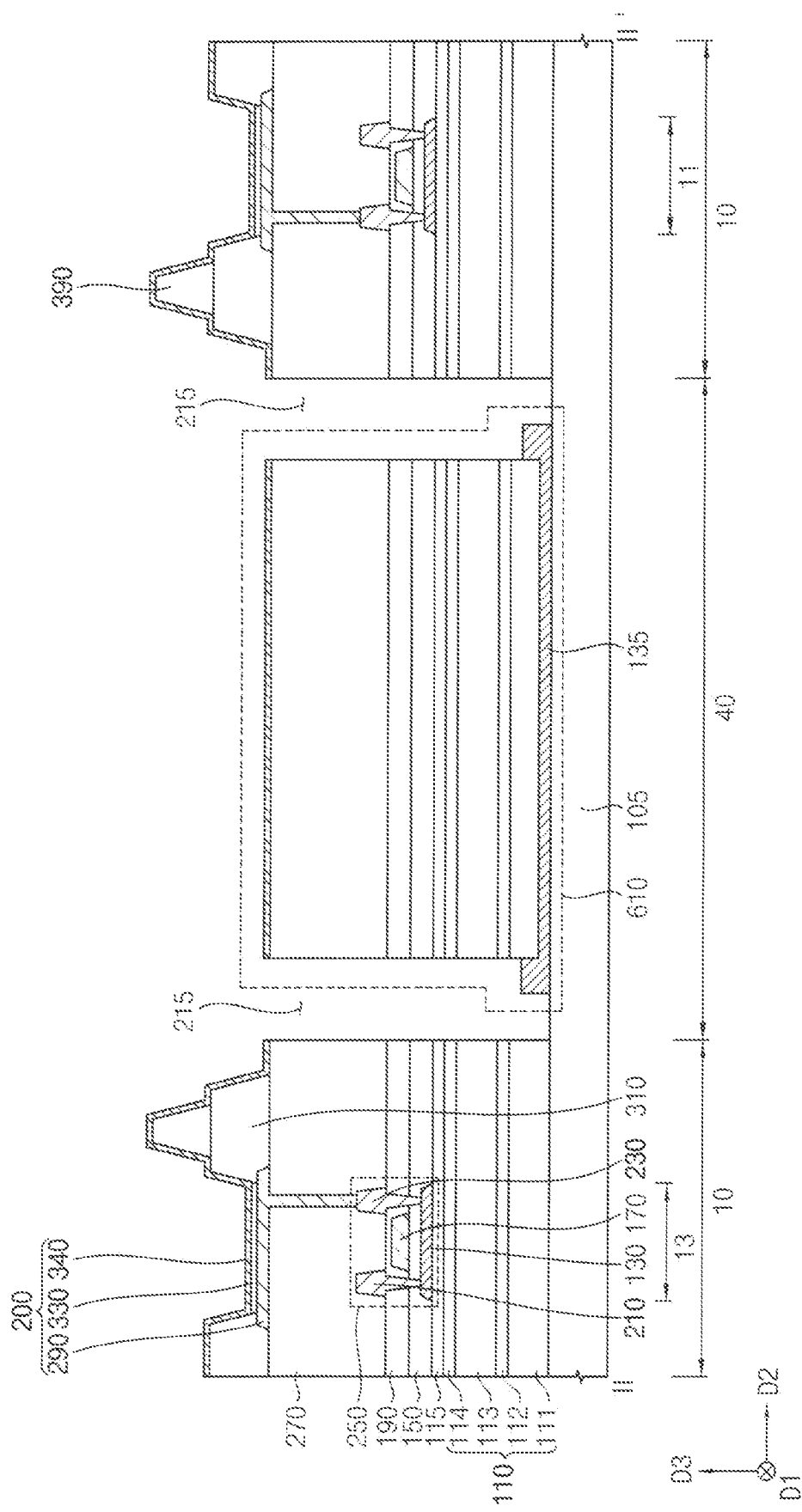

Referring to FIGS. 16 and 17, the portions of the preliminary substrate 510, the buffer layer 115, the gate insulating layer 150, the interlayer insulating layer 190, the planarization layer 270, and the upper electrode 340, which are located where the laser is irradiated, may be removed, and an opening 215 may be formed in the outermost peripheral portion of the contact region 40. The opening 215 may expose a part of the contact pattern 135, and a part of the glass substrate 105. After the opening 215 is formed, the preliminary substrate 510 located at (e.g., in or on) the pixel regions 10 and the connection regions 30 on the glass substrate 105 may be defined as the substrate 110. For example, the substrate 110 may be located at (e.g., in or on) an outer periphery of the opening 215. In addition, portions of the preliminary substrate 510, the buffer layer 115, the gate insulating layer 150, the interlayer insulating layer 190, the planarization layer 270, and the upper electrode 340, which are formed on the contact pattern 135 on the glass substrate 105, may be defined as a first dummy pattern 610. For example, the first dummy pattern 610 may be located at (e.g., in or on) an inner side of the opening 215.

Figure 18:
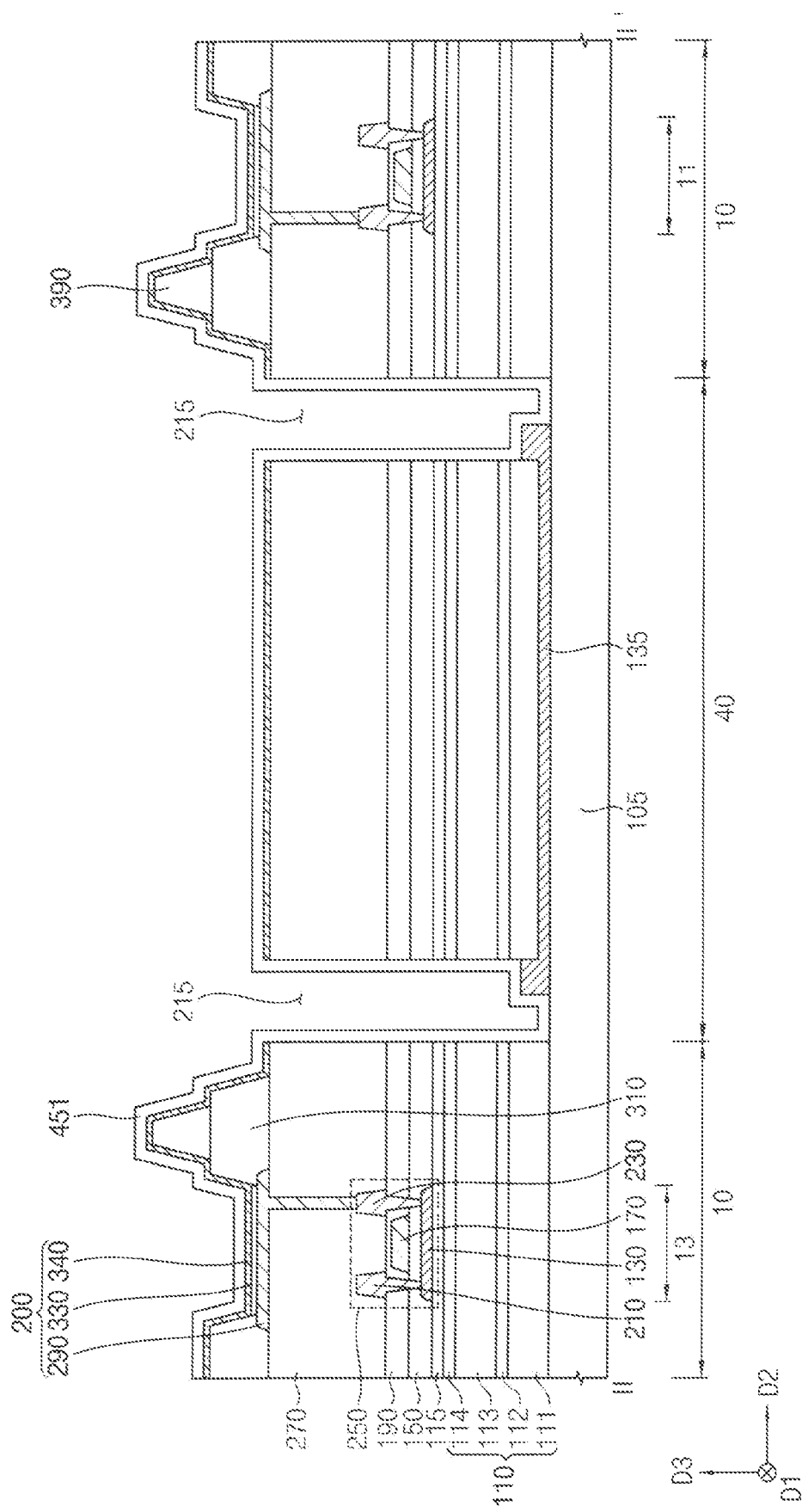

Referring to FIG. 18, the first inorganic thin film encapsulation layer 451 may be formed on the glass substrate 105 over an entire area of the pixel region 10, the connection region 30, and the contact region 40. In other words, the first inorganic thin film encapsulation layer 451 may be formed on the upper electrode 340, the side wall of the substrate 110, the side wall of the buffer layer 115, the side wall of the gate insulating layer 150, the side wall of the interlayer insulating layer 190, the side wall of the planarization layer 270, a side wall of the first dummy pattern 610, a top surface of the glass substrate 105 located at (e.g., in or on) the opening 215, and the protrusion of the contact pattern 135 located at (e.g., in or on) the opening 215. The side walls of these layers may be adjacent to the opening 215. In addition, the first inorganic thin film encapsulation layer 451 may also be formed on the first dummy pattern 610.

The first inorganic thin film encapsulation layer 451 may be formed along a profile of the side wall of each of the upper electrode 340, the substrate 110, the buffer layer 115, the gate insulating layer 150, the interlayer insulating layer 190, the planarization layer 270, and the first dummy pattern 610, the top surface of the glass substrate 105 located at (e.g., in or on) the opening 215, and the protrusion of the contact pattern 135 located at (e.g., in or on) the opening 215 with a uniform or substantially uniform thickness to cover the side wall of each of the upper electrode 340, the substrate 110, the buffer layer 115, the gate insulating layer 150, the interlayer insulating layer 190, the planarization layer 270, and the first dummy pattern 610, the top surface of the glass substrate 105 located at (e.g., in or on) the opening 215, and the protrusion of the contact pattern 135 located at (e.g., in or on) the opening 215. The first inorganic thin film encapsulation layer 451 may prevent or substantially prevent the sub-pixel structure 200 from deteriorating due to infiltration of moisture, oxygen, and/or the like. In addition, the first inorganic thin film encapsulation layer 451 may also perform a function of protecting the sub-pixel structure 200 from an external impact. The first inorganic thin film encapsulation layer 451 may be formed by using one or more inorganic insulating materials having flexibility.

Figure 19:
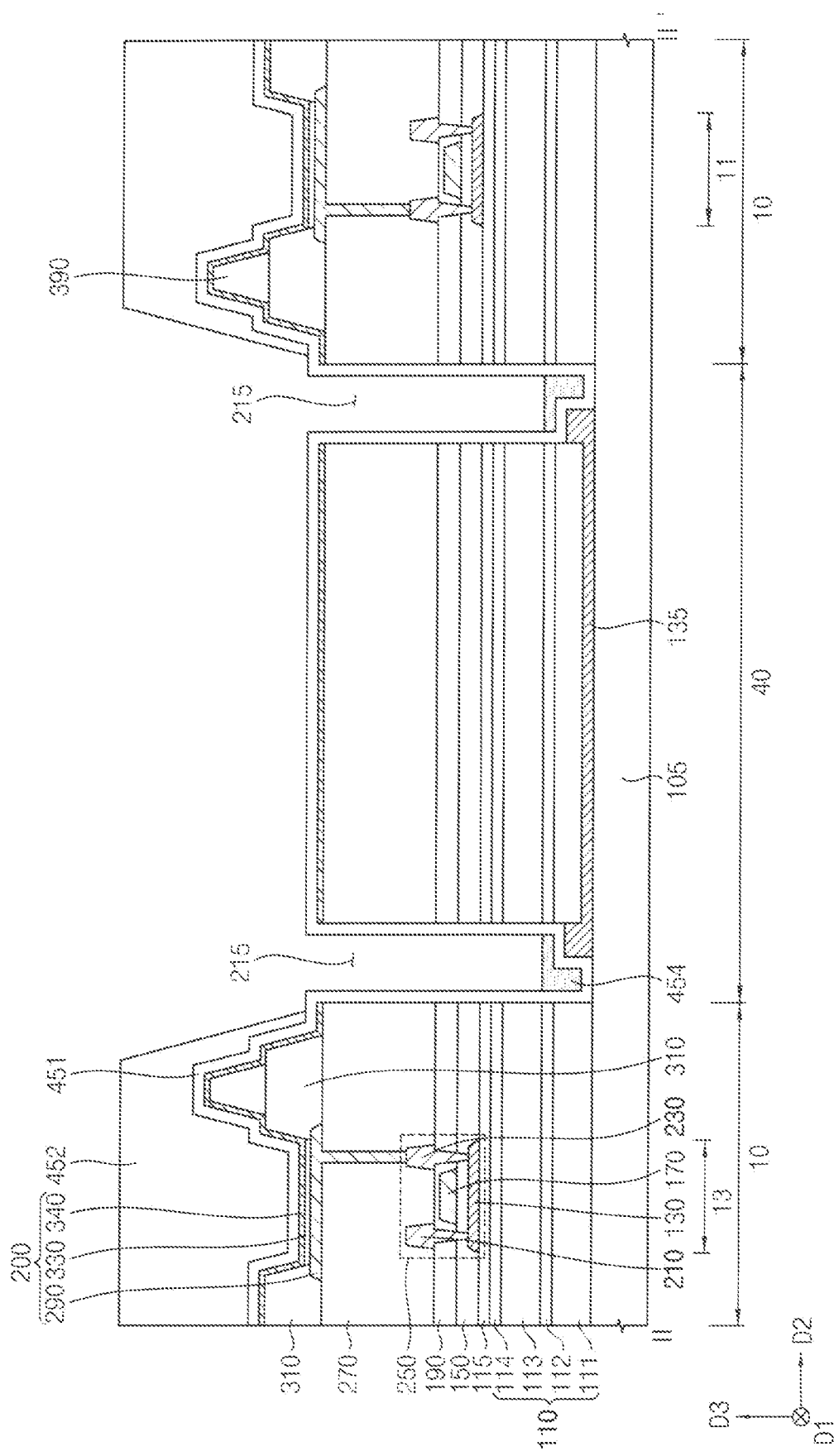

Referring to FIG. 19, the organic thin film encapsulation layer 452 may be formed on the first inorganic thin film encapsulation layer 451 at (e.g., in or on) the pixel region 10. While the organic thin film encapsulation layer 452 is formed on the first inorganic thin film encapsulation layer 451, a part of the organic thin film encapsulation layer 452 may be formed in the opening 215. In this case, the part of the organic thin film encapsulation layer 452 that is formed in the opening 215 is defined as an organic pattern 454. In some embodiments, the organic thin film encapsulation layer 452 may be formed on the first inorganic thin film encapsulation layer 451 at (e.g., in or on) the connection region 30. The organic thin film encapsulation layer 452 may improve a flatness of the organic light emitting display device, and may protect the sub-pixel structure 200 together with the first inorganic thin film encapsulation layer 451. The organic thin film encapsulation layer 452 may be formed by using one or more organic insulating materials having flexibility.

Because the organic pattern 454 is formed in the opening 215, the organic pattern 454 may be formed along an outermost periphery of the contact region 40. In other words, the organic pattern 454 may be formed on the first inorganic thin film encapsulation layer 451 along a profile of the opening 215. As described above, the organic pattern 454 may be formed concurrently (e.g., simultaneously) with the organic thin film encapsulation layer 452 by using the same or substantially the same material as that of the organic thin film encapsulation layer 452. For example, the organic pattern 454 may include an organic insulating material such as a photoresist, acryl, polyacryl, polyimide, polyamide, epoxy, acrylate monomer, phenylacetylene, diamine, dianhydride, siloxane, polysiloxane, silane, parylene, olefin-based polymer, polyethylene terephthalate, and/or fluorine. In some embodiments, the organic pattern 454 may include a resin including the organic insulating material as a base material.

Figure 20:
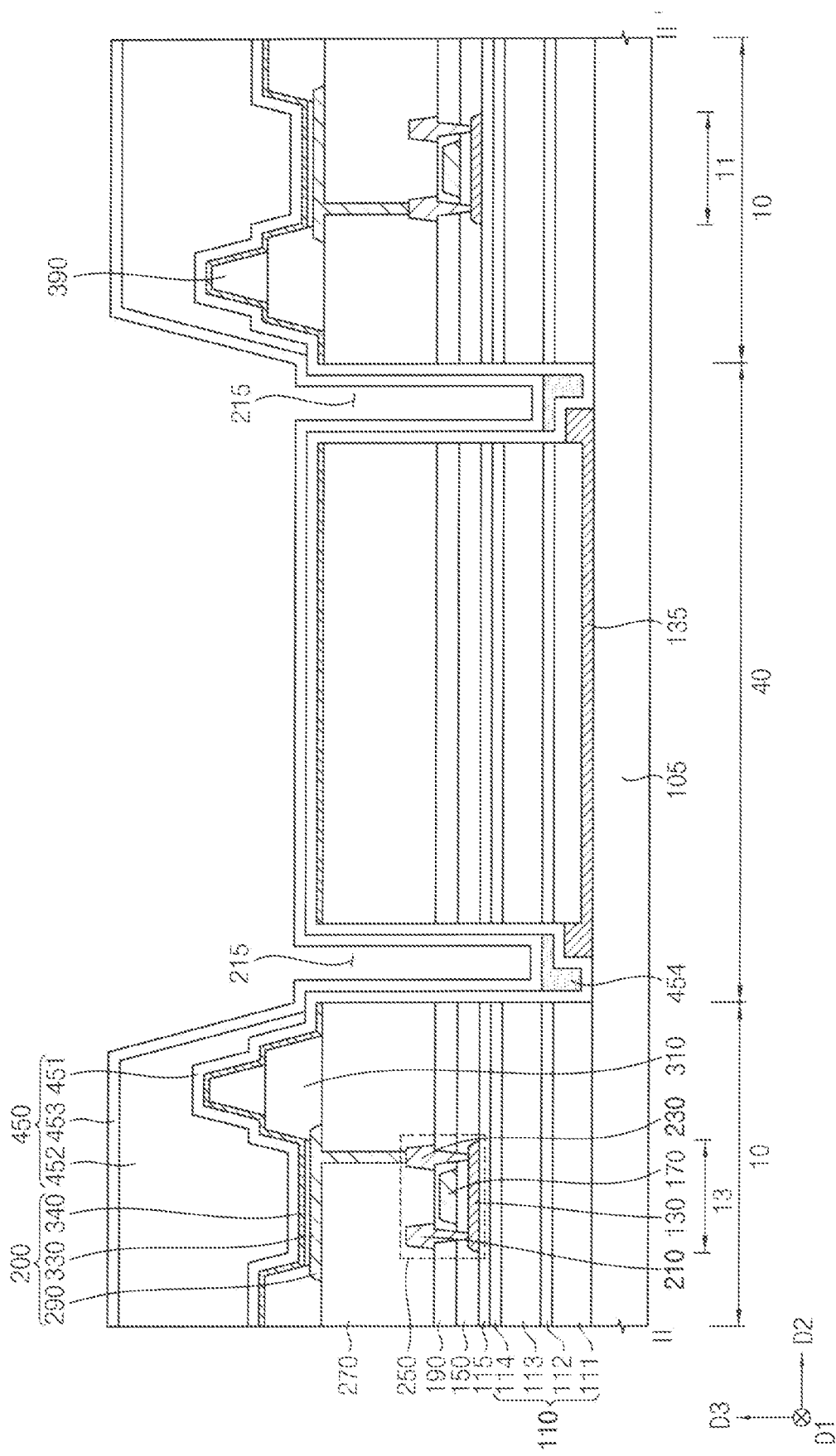

Referring to FIG. 20, the second inorganic thin film encapsulation layer 453 may be formed on the first inorganic thin film encapsulation layer 451 and the organic thin film encapsulation layer 452 over the entire area of the pixel region 10, the connection region 30, and the contact region 40. The second inorganic thin film encapsulation layer 453 may be formed along a profile of the first inorganic thin film encapsulation layer 451, the organic thin film encapsulation layer 452, and the organic pattern 454 with a uniform or substantially uniform thickness to cover the organic thin film encapsulation layer 452. In other words, the second inorganic thin film encapsulation layer 453 may be formed on the first inorganic thin film encapsulation layer 451 that is formed on the side wall of the substrate 110 adjacent to the opening 215, and may cover the organic pattern 454. Thus, the organic pattern 454 may be surrounded (e.g., around a periphery thereof) by the first inorganic thin film encapsulation layer 451 and the second inorganic thin film encapsulation layer 453. In addition, the second inorganic thin film encapsulation layer 453 may also be formed on the first dummy pattern 610.

The second inorganic thin film encapsulation layer 453 may prevent or substantially prevent the sub-pixel structure 200 from deteriorating due to the infiltration of moisture, oxygen, and/or the like together with the first inorganic thin film encapsulation layer 451. In addition, the second inorganic thin film encapsulation layer 453 may also perform a function of protecting the sub-pixel structure 200 from an external impact together with the first inorganic thin film encapsulation layer 451 and the organic thin film encapsulation layer 452. The second inorganic thin film encapsulation layer 453 may be formed by using one or more inorganic insulating materials having flexibility.

For a comparative example, in a process of forming a second inorganic thin film encapsulation layer in a method of manufacturing a comparative organic light emitting display device that does not include the contact pattern 135 and the organic pattern 454, a depth of an opening in the third direction D3 may be increased (e.g., may be deeper), and a width of the opening in the second direction D2 may be reduced by forming a first inorganic thin film encapsulation layer in the opening. Thus, a thickness of the second inorganic thin film encapsulation layer may become relatively thinner at a lower end portion of the opening (e.g., at a portion of the opening where the substrate is located). In this case, during a process of peeling the substrate from the glass substrate in the method of manufacturing the comparative organic light emitting display device, the second inorganic thin film encapsulation layer may be excessively torn off on a side wall of the substrate, so that only the first inorganic thin film encapsulation layer may remain on the side wall of the substrate. In this case, a path for blocking permeation of water and/or moisture that may infiltrate from the outside may be relatively shortened at the side wall of the substrate, which may cause the infiltration of the water and/or moisture into the substrate.

According to one or more embodiments of the present disclosure, because the protrusion of the contact pattern 135 and the organic pattern 454 are formed at a portion of the glass substrate 105 where the opening 215 is located, the second inorganic thin film encapsulation layer 453 may not extend to a lower end portion of the opening 215. Accordingly, in a process of forming the second inorganic thin film encapsulation layer 453, a thickness of the second inorganic thin film encapsulation layer 453 may not become thinner inside the opening 215.

Figure 21:
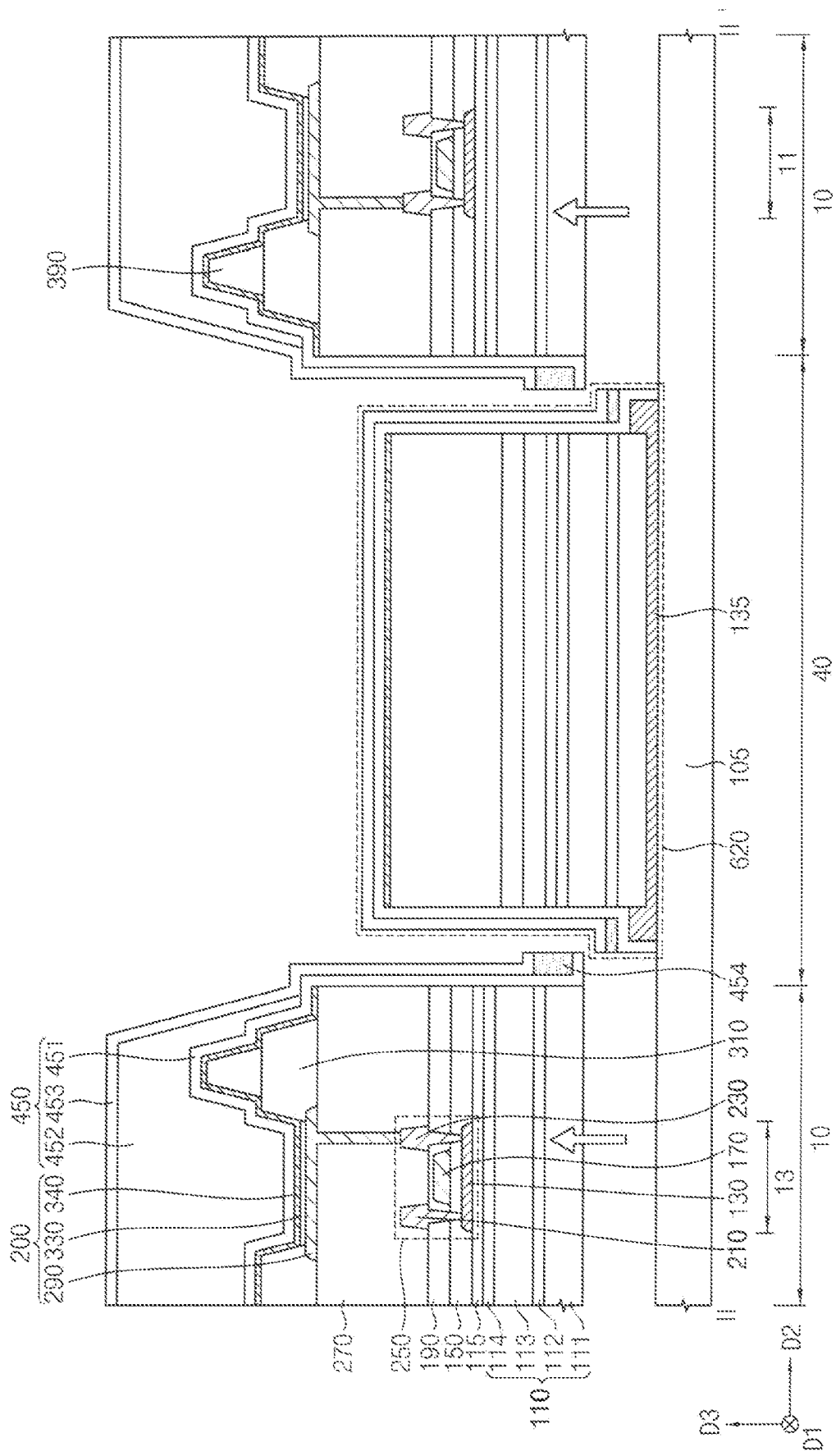

Referring to FIGS. 21 and 22, the first dummy pattern 610 on which the first inorganic thin film encapsulation layer 451 and the second inorganic thin film encapsulation layer 453 are formed is defined as a second dummy pattern 620. In addition, the substrate 110 located at (e.g., in or on) each of the pixel regions 10 is defined as a display part 520, and the substrate 110 located at (e.g., in or on) each of the connection regions 30 is defined as a connection part 120. In other words, the substrate 110 may include the display part 520 and the connection part 120.

The substrate 110 may be peeled from the glass substrate 105 in the third direction D3, while the second dummy pattern 620 formed on the contact pattern 135 is fixed onto the glass substrate 105. In this case, the second dummy pattern 620 may have a relatively large adhesive strength by contacting (e.g., by making contact with) the contact pattern 135, so that the second dummy pattern 620 may not be peeled from the contact pattern 135 in the peeling process. In the peeling process, a part of the first inorganic thin film encapsulation layer 451, a part of the organic pattern 454, and a part of the second inorganic thin film encapsulation layer 453 may remain at a portion overlapping with the protrusion of the contact pattern 135.

In one or more embodiments, because the protrusion of the contact pattern 135 is formed in the opening 215, an area in which the first inorganic thin film encapsulation layer 451 makes contact with the glass substrate 105 may be relatively reduced, and the first inorganic thin film encapsulation layer 451 may be easily peeled from the glass substrate 105 in the peeling process.

When the substrate 110 is peeled off, portions of the first inorganic thin film encapsulation layer 451, the organic pattern 454, and the second inorganic thin film encapsulation layer 453 that are located in the opening 215 may be separated. Accordingly, the first inorganic thin film encapsulation layer 451 may be formed with a protrusion that protrudes from a portion of the first inorganic thin film encapsulation layer 451 that is adjacent to the bottom surface of the substrate 110 (e.g., that is adjacent to the bottom surface of the first organic film layer 111) in a direction from the side wall of the substrate 110 to the opening 215. In addition, the organic pattern 454 may be located on the protrusion of the first inorganic thin film encapsulation layer 451. For example, a bottom surface of the organic pattern 454 may contact (e.g., may make contact with) the protrusion of the first inorganic thin film encapsulation layer 451, a top surface of the organic pattern 454 may contact (e.g., may make contact with) the second inorganic thin film encapsulation layer 453, a first side surface of the organic pattern 454 may contact (e.g., may make contact with) the first inorganic thin film encapsulation layer 451, and a second side surface (e.g., opposite to the first side surface) of the organic pattern 454 may be exposed. The second inorganic thin film encapsulation layer 453 may be located on the organic pattern 454.

As shown in FIG. 22, the through-opening 205 that is surrounded (e.g., around a periphery thereof) by the substrate 110 formed at (e.g., in or on) the adjacent pixel regions 10 from among the pixel regions 10 (e.g., the display part 520) and the connection regions 30 located between the adjacent pixel regions 10 (e.g., the connection part 120), respectively, may be formed. For example, the through-opening 205 may correspond to the contact region 40 at (e.g., in or on) which the opening 215, the contact pattern 135, and the second dummy pattern 620 are formed. In one or more embodiments, the organic pattern 454 may be formed on the protrusion of the first inorganic thin film encapsulation layer 451 along the profile of the outermost periphery of the through-opening 205.

Accordingly, the organic light emitting display device 100 shown in FIGS. 1, 5, and 6 may be manufactured, and the method of manufacturing the organic light emitting display device 100 may be provided.

In the method of manufacturing the organic light emitting display device according to one or more embodiments of the present disclosure, because the organic pattern 454 and the protrusion of the contact pattern 135 are formed at the portion of the glass substrate 105 where the opening 215 is located, the thickness of the second inorganic thin film encapsulation layer 453 may not be reduced (e.g., may not become thinner) inside the opening 215, and thus, the second inorganic thin film encapsulation layer 453 may not be excessively torn off in the process of peeling the substrate 110 from the glass substrate 105. Accordingly, a defect of the organic light emitting display device may be reduced.

In addition, because the protrusion of the contact pattern 135 is formed in the opening 215, the area in which the first inorganic thin film encapsulation layer 451 contacts (e.g., makes contact with) the glass substrate 105 may be relatively reduced, and the first inorganic thin film encapsulation layer 451 may be easily peeled from the glass substrate 105 in the peeling process.

Embodiments of the present disclosure may be applied to various suitable electronic devices having an organic light emitting display device. For example, one or more embodiments of the present disclosure may be applied to various suitable electronic devices, such as a vehicle-display device, a ship-display device, an aircraft-display device, portable communication devices, display devices for display or for information transfer, a medical-display device, and the like.

Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various embodiments and is not to be construed as limited to the specific embodiments disclosed herein, and that various modifications to the disclosed embodiments, as well as other embodiments, are intended to be included within the spirit and scope of the present disclosure as defined in the appended claims, and their equivalents.

What is claimed is:

1. A method of manufacturing an organic light emitting display device, the method comprising:

providing a glass substrate comprising:
  pixel regions;
  connection regions between adjacent pixel regions from among the pixel regions, respectively; and
  a contact region surrounded by the adjacent pixel regions and the connection regions respectively between the adjacent pixel regions;
forming a contact pattern on the glass substrate at the contact region;
forming a preliminary substrate on the glass substrate and the contact pattern;
forming a sub-pixel structure on the preliminary substrate at each of the pixel regions;
forming an opening that exposes a part of the contact pattern and a part of the glass substrate by removing a portion of the preliminary substrate that overlaps with an outermost periphery portion of the contact region; and
forming a substrate at the pixel regions and the connection regions, and a dummy pattern on the contact pattern, after forming the opening.

2. The method of claim 1, further comprising:
forming a first inorganic thin film encapsulation layer over an entire area of the glass substrate;
forming a part of an organic thin film encapsulation layer in the opening while forming the organic thin film encapsulation layer on the first inorganic thin film encapsulation layer; and
forming a second inorganic thin film encapsulation layer on the first inorganic thin film encapsulation layer and the organic thin film encapsulation layer.

3. The method of claim 2, wherein the part of the organic thin film encapsulation layer in the opening is defined as an organic pattern, and the organic pattern is surrounded by the first and second inorganic thin film encapsulation layers.

4. The method of claim 2, further comprising peeling the substrate from the glass substrate while the dummy pattern formed on the contact pattern is fixed onto the glass substrate.

5. The method of claim 4, wherein a through-opening surrounded by the substrate at the adjacent pixel regions and the connection regions respectively between the adjacent pixel regions is defined after the substrate is peeled from the glass substrate.

6. The method of claim 1, wherein the contact pattern comprises a protrusion that protrudes in a direction from the glass substrate to the sub-pixel structure from a top surface of the contact pattern at an outermost peripheral portion of the contact pattern, and wherein the protrusion is exposed by the opening.

* * * * *